US012614692B2

(12) United States Patent
Uchioke et al.

(10) Patent No.: US 12,614,692 B2
(45) Date of Patent: Apr. 28, 2026

(54) CHARGED PARTICLE BEAM APPARATUS

(71) Applicant: Hitachi High-Tech Corporation,
Tokyo (JP)

(72) Inventors: Yuki Uchioke, Tokyo (JP); Masaru Matsushima, Tokyo (JP); Masaki Mizuochi, Tokyo (JP); Go Miya, Tokyo (JP); Katsumi Kambe, Tokyo (JP)

(73) Assignee: Hitachi High-Tech Corporation,
Tokyo (JP)

( * ) Notice: Subject to any disclaimer, the term of this patent is extended or adjusted under 35 U.S.C. 154(b) by 413 days.

(21) Appl. No.: 18/507,857

(22) Filed: Nov. 13, 2023

(65) Prior Publication Data

US 2024/0177963 A1 May 30, 2024

(30) Foreign Application Priority Data

Nov. 25, 2022 (JP) ................................. 2022-188568

(51) Int. Cl.
*H01J 37/20* (2006.01)
*H01J 37/22* (2006.01)
(52) U.S. Cl.
CPC ............ *H01J 37/20* (2013.01); *H01J 37/222* (2013.01); *H01J 2237/2001* (2013.01); *H01J 2237/20214* (2013.01); *H01J 2237/221* (2013.01)
(58) Field of Classification Search
CPC .. H01J 37/00; H01J 37/02; H01J 37/20; H01J 37/222; H01J 37/261; H01J 37/165; H01J 37/26; H01J 37/28; H01J 2237/2001; H01J 2237/20214; H01J 2237/221; H01J 2237/0216; H01J 2237/002; H05K 7/20209

USPC .............................. 250/306, 307, 311, 440.11
See application file for complete search history.

(56) References Cited

U.S. PATENT DOCUMENTS

| | | | | |
|---|---|---|---|---|
| 2006/0255290 | A1* | 11/2006 | Bhadare | H01J 37/02 |
| | | | | 250/397 |
| 2017/0318701 | A1* | 11/2017 | Steiner | F24F 11/88 |
| 2022/0076918 | A1* | 3/2022 | Nishioka | H01L 21/67739 |

FOREIGN PATENT DOCUMENTS

JP        2022-44860 A        3/2022

\* cited by examiner

*Primary Examiner* — Jason L Mccormack
(74) *Attorney, Agent, or Firm* — Crowell & Moring LLP

(57) ABSTRACT

To provide a technique of the above charged particle beam apparatus, a technique that can prevent the lowering of apparatus performance due to the influence of vibration and noise by an air blower (fan). The charged particle beam apparatus includes a body device that is provided in a body cover, a plurality of air blowers that are provided on the body cover, and a controller that controls the plurality of air blowers. The body device has a stage on which a sample is placed, and a microscope that images the sample. The controller obtains an image obtained by imaging the sample by the microscope, obtains vibration information from the image, compares the vibration information and a specification value, and on the basis of the result of the comparison, controls the numbers of rotations of the plurality of air blowers. The controller decreases the number of rotations of at least one first air blower among the plurality of air blowers, and increases the number of rotations of at least one different second air blower among the plurality of air blowers.

16 Claims, 20 Drawing Sheets

FAN #1
· ON /OFF
· R1, F1, Q1

FAN #2
· ON /OFF
· R2, F2, Q2

FAN #3
· ON /OFF
· R3, F3, Q3

FAN #4
· ON /OFF
· R4, F4, Q4

FAN #5
· ON /OFF
· R5, F5, Q5

NUMBER OF ROTATIONS: R
ROTATION FREQUENCY: F
AIR QUANTITY: Q

FIG. 11A

| | ABSENCE OF IMAGE SHAKING (AMPLITUDE ≤ SPECIFICATION VALUE) | PRESENCE OF IMAGE SHAKING (AMPLITUDE > SPECIFICATION VALUE) |
|---|---|---|
| STATE WHERE ALL FANS ARE STOPPED | CASE A →OK | CASE B →NG |
| STATE WHERE ALL FANS ARE OPERATED | CASE C →OK | CASE D →NG |

FIG. 11B

| COMBINATION | CAUSE ESTIMATION | WHETHER CONTROL OF FAN IS REQUIRED OR NOT REQUIRED |
|---|---|---|
| CASE A+C | –(NONE) | NOT REQUIRED |
| CASE A+D | CAUSED BY FAN | REQUIRED |
| CASE B+C | CAUSED BY OTHER THAN FAN | NOT REQUIRED |
| CASE B+D | CAUSED BY OTHER THAN FAN | NOT REQUIRED |

FIG. 13A

BEFORE ADJUSTMENT

|        | AIR QUANTITY Q OF FAN | NUMBER OF ROTATIONS R OF FAN |
|--------|--------|--------|
| FAN #1 | Q1 (QA) | R1 (RA) |
| FAN #2 | Q2 (QA) | R2 (RA) |
| FAN #3 | Q3 (QA) | R3 (RA) |
| FAN #4 | Q4 (QA) | R4 (RA) |
| FAN #5 | Q5 (QA) | R5 (RA) |

QA: CERTAIN VALUE
RA: CERTAIN VALUE $$QALL = Q1 + \cdots + Q5$$
$$= QA \times 5 = AV1$$

AV1: NECESSARY EXHAUST
        AIR QUANTITY

FIG. 13B

AFTER ADJUSTMENT

|        | AIR QUANTITY Q OF FAN | NUMBER OF ROTATIONS R OF FAN |
|--------|--------|--------|
| FAN #1 | Q1 (QB) | R1 (RB) |
| FAN #2 | Q2 (QC) | R2 (RC) |
| FAN #3 | Q3 (QC) | R3 (RC) |
| FAN #4 | Q4 (QC) | R4 (RC) |
| FAN #5 | Q5 (QC) | R5 (RC) |

RB: VALUE AFTER DECREASE (RB<RA)
QB: VALUE AFTER DECREASE (QB<QA)
RC: VALUE AFTER INCREASE (RC>RA)
QC: VALUE AFTER INCREASE (QC>QA)

$$RB = RA \times (100 - X\%)$$
$$RC = RA \times (100 + Y\%)$$

$$QALL = Q1 + \cdots + Q5$$
$$= QB + QC \times 4 = AV1$$

FIG. 13C

AFTER ADJUSTMENT (ANOTHER EXAMPLE)

|        | AIR QUANTITY Q OF FAN | NUMBER OF ROTATIONS R OF FAN |
|--------|--------|--------|
| FAN #1 | Q1 (QB) | R1 (RB) |
| FAN #2 | Q2 (QD) | R2 (RD) |
| FAN #3 | Q3 (QA) | R3 (RA) |
| FAN #4 | Q4 (QA) | R4 (RA) |
| FAN #5 | Q5 (QA) | R5 (RA) |

$$QALL = Q1 + \cdots + Q5$$
$$= QB + QD + QA \times 3 = AV1$$

FIG. 14

SPECIFICATIONS OF FAN

|  | FAN A | FAN B | FAN C |
|---|---|---|---|
| MODEL | A | B | C |
| TYPE OF NUMBER OF ROTATIONS | FIXED | FIXED | VARIABLE |
| NUMBER OF ROTATIONS | Ra | Rb | Rcmin~Rcmax |
| ELECTRIC CURRENT | Ia | Ib | Icmin~Icmax |
| ROTATION SPEED | va | vb | vcmin~vcmax |
| ROTATION FREQUENCY | Fa | Fb | Fcmin~Fcmax |
| MAXIMUM AIR QUANTITY | Qa | Qb | Qcmin~Qcmax |
| MAXIMUM STATIC PRESSURE | Pa | Pb | Pcmin~Pcmax |
| NOISE LEVEL | La | Lb | Lcmin~Lcmax |
| AMBIENT TEMPERATURE USED | Ta | Tb | Tc |
| LIFE | Ya | Yb | Yc |
| ... | ... | ... | ... |

CHARGED PARTICLE BEAM APPARATUS

TECHNICAL FIELD

This disclosure relates to a technique of a charged particle beam apparatus, and more specifically, to a technique of an air blower (in other words, a fan).

BACKGROUND ART

As a charged particle beam apparatus, there are, for example, various apparatuses, such as a semiconductor inspection apparatus, for example, imaging, measuring, inspecting, and evaluating the shape and dimension of a circuit pattern formed on a semiconductor wafer. As the apparatus, there are, for example, a length measurement SEM (SEM: scanning electron microscope) that images the wafer by using an electron microscope to measure the dimension of a circuit, and the like. With the miniaturization of a semiconductor device, a technique that handles the position and the like of the semiconductor device at high accuracy is required, not only in a semiconductor manufacturing apparatus, but also in the semiconductor inspection apparatus, such as the length measurement SEM, and the like. Hereinbelow, various apparatuses, such as the semiconductor manufacturing apparatus, the semiconductor inspection apparatus, and a semiconductor processing apparatus, may be collectively referred to as the charged particle beam apparatus.

In a current semiconductor circuit, the circuit is formed with the line width of several nanometers (nm), and the circuits are arrayed at the interval of the order as that. When such the semiconductor circuit is imaged by the electron microscope for inspection, the semiconductor circuit is imaged in a very small field of view. However, for example, even when slight temperature change is caused in the stage device that positions the wafer, the thermal deformation of the stage device moves the position of the stationary wafer. In that case, the position on the wafer that is being imaged may also be unidentified.

For example, since the electron microscope is used in the length measurement SEM, the semiconductor wafer that is a sample is required to be placed in the vacuum chamber that is a sample chamber. In the interior of the sample chamber, the stage device is present, and the stage device positions the wafer. From this, the temperature in the sample chamber itself is required to be kept as constant as possible.

Likewise, also in the semiconductor manufacturing apparatus and the like, even when the device that performs the positioning of the wafer and the like causes slight temperature change, the position of the semiconductor circuit manufactured is displaced. Consequently, it is important that for the device that performs the positioning and the like of the wafer, and the like, the temperature change be minimized and the temperature be stabilized at high accuracy.

On the other hand, in the case of the charged particle beam apparatus, such as the semiconductor inspection apparatus, into which a device that uses an electron beam (in other words, a charged particle beam), such as the electron microscope, is incorporated, when the noise of an electromagnetic wave intrudes from the outside, slight change is caused in the trajectory of the electron beam, thus causing accuracy deterioration. For this, in the charged particle beam apparatus, the entire apparatus (in other words, a body device) is covered by a metal cover (that may be described as a body cover), thereby preventing the intrusion of the electromagnetic noise, which is effective for improving the accuracy.

In addition, in the device that pursues the precision of the nm order, a problem that due to the intrusion of a sound wave, the sound vibrates the device, and the vibration becomes noise in imaging and the like is also caused. Thus, covering the device body by the cover also has a role of preventing the intrusion of the sound wave due to the noise caused by other devices and the like around the device. However, the charged particle beam apparatus uses various control devices and the like in order to drive and control the body device, such as, for example, the electron microscope and the stage device, and the body device, the control device, and the like become a set to be one system. For this, the body cover also includes, in its interior, in addition to the body device, many control devices and the like. In addition, the control device referred herein also includes, in its interior, the power supply device for the control device and the like.

In the control device and the like, heat generated with energy loss is caused in using electricity. For the generated heat in each component, such as the control device, when the flow of air is present around the component, the generated heat is released through the air, but when viewed in the entire charged particle beam apparatus, the generated heat in the each component causes air temperature increase in the body cover. Such the air temperature increase leads to the thermal deformation of the stage device and the like that are contacted with the semiconductor wafer, thereby causing accuracy deterioration.

As a conventional art example, there is Japanese Unexamined Patent Application Publication No. 2022-44860 (Patent Literature 1). Patent Literature 1 describes that a semiconductor processing apparatus suppresses the intrusion of electromagnetic noise and noise from the outside, and suppresses the influence of heat generated by a control device on a semiconductor. Patent Literature 1 describes that the semiconductor processing apparatus includes a body cover that covers a body device and a control device, the body cover has a receiving/passing opening for receiving or passing a semiconductor, and the body cover further has an exhaust port that generates an air flow in a horizontal direction in the interior of the body cover.

CITATION LIST

Patent Literature

Patent Literature 1: Japanese Unexamined Patent Application Publication No. 2022-44860

SUMMARY OF INVENTION

Technical Problem

Patent Literature 1 describes that in part of the body cover, a fan (an exhaust fan 11) for heat exhaustion is mounted, thereby uniformly cooling the temperature in the apparatus.

As a method for keeping the inner air temperature in the charged particle beam apparatus constant, like the example of Patent Literature 1, there is a method by which in part of a body cover that covers a body device, an air blower (that may be described as a fan and the like) for heat exhaustion and cooling is provided, thereby discharging exhaust heat in the apparatus.

On the other hand, with the miniaturization of the semiconductor, the apparatus performance is improved, so that the exhaust heat amount of the apparatus is also increased.

For that, as one solution, the increase in the output and the mounting number of fans used for heat exhaustion is given.

However, the increase in the output and the mounting number of fans leads to the increase of vibration and noise according to that. The charged particle beam apparatus itself receives those vibration and noise, which inhibits the precise operation. For example, the electron microscope and the stage device receive the vibration and noise by the fan, which affects the operation of the imaging of the wafer, so that the accuracy and quality may be lowered. For example, when due to the influence of the vibration by the fan, resonance with the stage device and the like is caused, the wafer on the stage is slightly moved, which may cause shaking and noise in the contents of an image captured by the electron microscope (in other words, an SEM image).

Accordingly, in the charged particle beam apparatus, a technique for keeping the temperature in the apparatus covered by the body cover constant while reducing the vibration and noise by the fan is required. In other words, in the charged particle beam apparatus, a technique that prevents the temperature increase in the apparatus that is covered by the body cover, and prevents the lowering of the apparatus performance due to the influence of the vibration and noise by the fan is required.

An object of this disclosure is to provide, regarding a technique of the above charged particle beam apparatus, a technique that can prevent the lowering of apparatus performance due to the influence of vibration and noise by an air blower (fan).

Solution to Problem

A representative embodiment of this disclosure has a configuration described below. A charged particle beam apparatus of the embodiment includes a body device that is provided in a body cover, a plurality of air blowers that are provided on the body cover, and a controller that controls the plurality of air blowers. The body device has a stage on which a sample is placed, and a microscope that images the sample. The controller obtains an image obtained by imaging the sample by the microscope, obtains vibration information from the image, compares the vibration information and a specification value, and on the basis of the result of the comparison, controls the numbers of rotations of the plurality of air blowers.

Advantageous Effects of Invention

According to the representative embodiment of this disclosure, regarding the technique of the above charged particle beam apparatus, the lowering of the apparatus performance due to the influence of the vibration and noise by the air blower (fan) can be prevented. Objects, configurations, effects, and the like other than the above will be illustrated in modes for carrying out the invention.

BRIEF DESCRIPTION OF DRAWINGS

FIGS. 11A and 11B are explanatory views of judgement by the controller according to the first embodiment;

FIGS. 13A to 13C are diagrams illustrating the examples of the states before and after the adjustment of the plurality of air blowers according to the first embodiment;

FIG. 14 is a diagram illustrating the example of the specifications of the air blowers according to the first embodiment;

FIG. 20 is a diagram illustrating a configuration example in which the controller controls the plurality of air blowers according to a modification example of the first embodiment and the like;

FIG. 21 is a diagram illustrating a configuration example in which the charged particle beam apparatus has a fan control function in an external computer system with respect to the controller according to a modification example of the first embodiment and the like; and FIG. 22 is a diagram illustrating a configuration example in which the charged particle beam apparatus has vibration sensors with respect to a sample chamber and a duct and a configuration example in which the charged particle beam apparatus has a sample for diagnosis on a stage according to a modification example of the first embodiment and the like.

DESCRIPTION OF EMBODIMENTS

Figure 1:
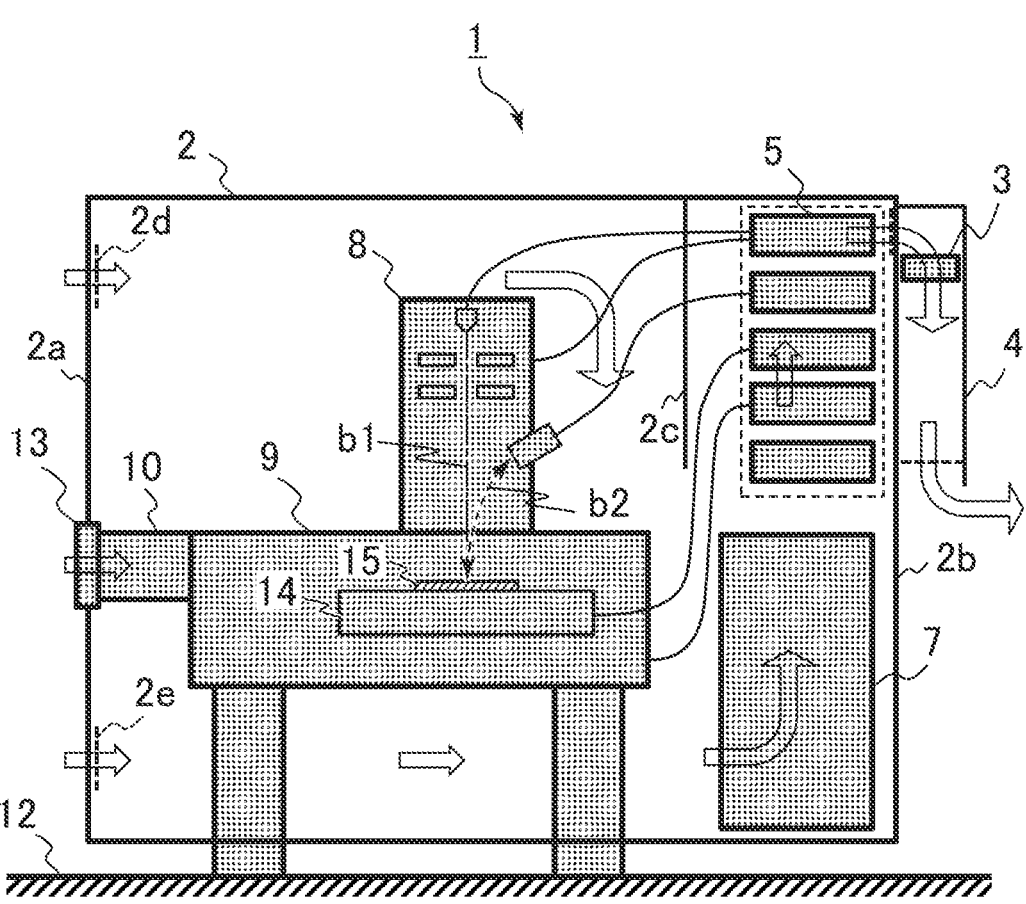
FIG. 1 is a diagram illustrating the configuration of a charged particle beam apparatus of a first embodiment.

Hereinbelow, embodiments of this disclosure will be described in detail with reference to the drawings. In the drawings, in principle, the same portions are indicated by the same reference numerals, and the repeated description is omitted. In the drawings, to simplify the understanding of the invention, the expression of the constituent element may not express the actual position, size, shape, range, and the like.

For the description, when the process by the program is described, the program, the function, the processing portion, and the like may be described as subjects, but the subjects as hardware for them are the processor, or the controller, the device, the calculator, the system, and the like that are configured of the processor and the like. While using the resources, such as the memory and the communication interface, as appropriate, the calculator executes the process according to the program read on the memory by the processor. Thus, the predetermined function, processing portion, and the like are achieved. The processor is configured of a semiconductor device, such as, for example, a CPU/MPU and a GPU, and the like. The process is not limited to the software program process, and can be implemented also by a dedicated circuit. As the dedicated circuit, an FPGA, an ASIC, a CPLD, and the like are applicable.

The program may be previously installed as data on the target calculator, or may be delivered as data from the program source to the target calculator. The program source may be a program delivery server on the communication network, or may be a non-transitory computer readable storage medium, for example, a memory card and a disk. The program may be configured of a plurality of modules. The computer system may be configured of a plurality of devices. The computer system may be configured of a client server system, a cloud computing system, an IoT system, and the like. Various data and information are configured of a structure, such as, for example, a table and a list, but the present invention is not limited to this. The expressions of identification information, an identifier, an ID, a name, a number, and the like can be replaced with each other.

Problem and Solving Means

In a conventional charged particle beam apparatus, when resonance with a body device (in other words, large vibration) is judged to be caused by an air blower (fan), the fan is simply replaced. In that case, the replaced fan is unused even if there is no failure.

A charged particle beam apparatus of each embodiment copes with that by the variable control of the numbers of rotations and the air quantities of a plurality of fans without replacing the fan that causes the resonance. In the charged particle beam apparatus of the embodiments, for each fan of the plurality of fans that are provided on a body cover, the one that is of the type in which the on/off of the rotation operation can be controlled and the number of rotations can be varied is used. The charged particle beam apparatus of the embodiments has a function of confirming and diagnosing the states of the plurality of fans and performing the variable control of the number of rotations.

The charged particle beam apparatus of the embodiments obtains vibration information from an image captured by an electron microscope in order to judge whether the control of the fan is required or not required. The vibration information is information that represents the vibration degree of the charged particle beam apparatus, in other words, information that represents the degree of the shaking and the like in the signal value of the captured image. The charged particle beam apparatus of the embodiments compares the vibration information with the specification value, and confirms whether the vibration information satisfies the specification value. When the vibration information does not satisfy the specification value, in other words, when the shaking and the like of the captured image are large and are judged to affect the operation of the length measurement and the like, the charged particle beam apparatus executes the control of the numbers of the rotations of the plurality of fans.

Specifically, in the number-of-rotations control, a controller of the charged particle beam apparatus decreases the number of rotations of at least one first air blower among the plurality of air blowers, and increases the number of rotations of at least one different second air blower among the plurality of air blowers. In addition, in the number-of-rotations control, the controller performs the number-of-rotations control of the plurality of air blowers so as to secure the total air quantity of the plurality of air blowers at a constant value or more.

In addition, when the fan that causes the resonance is identified, but the adjustment by the variable control of the numbers of rotations of the plurality of fans cannot cope with the causative fan, in other words, when the specification value of the vibration or the air quantity is not satisfied, the charged particle beam apparatus of the embodiments also has a function of outputting notification to a user so as to maintain and replace the fan that causes the resonance.

First Embodiment

A charged particle beam apparatus of a first embodiment of this disclosure will be described with reference to FIGS. 1 to 16. As illustrated in FIG. 9 and the like described later, in the charged particle beam apparatus of the first embodiment, a controller uses the vibration information of a captured image to confirm the presence or absence of vibration (image shaking and the like due to that) that is caused by, among a plurality of fans, the fan, and on the basis of that result, performs control so as to perform adjustment by varying the number of rotations of the fan.

Charged Particle Beam Apparatus

FIG. 1 illustrates the entire configuration of a semiconductor processing apparatus that is a charged particle beam apparatus 1 of the first embodiment. The first embodiment will be described by taking, as an example, the case where a body device of the semiconductor processing apparatus that is the charged particle beam apparatus 1 is a length measurement SEM. Without being limited to this, for the body device, a semiconductor manufacturing apparatus, a semiconductor inspection apparatus, and the like are likewise applicable.

The charged particle beam apparatus 1 is installed on a floor 12 in a clean room. The body device of the charged particle beam apparatus 1 is covered by a body cover 2. The charged particle beam apparatus 1 includes, in the body cover 2, a control device 5, a power supply device 7, an electron microscope 8, a sample chamber 9 (in other words, a vacuum chamber), a semiconductor loading/unloading device 10, and the like. The body device includes the electron microscope 8, the sample chamber 9, and the like. In the sample chamber 9, the charged particle beam apparatus 1 has a stage 14. To the body device, the control device 5 and the power supply device 7 are electrically connected. The control device 5 and the power supply device 7 are also covered by the body cover 2. In other words, in a space configured by the body cover 2, the body device and the control device 5 are installed. Each portion in the body cover 2 is disposed at a position where an air flow, thermal influence, and the like are considered.

On the side of a front surface 2a of the body cover 2, a receiving/passing opening 13 is present, the receiving/passing opening 13 being connected to the semiconductor loading/unloading device 10. The semiconductor loading/unloading device 10 is connected to the sample chamber 9. A semiconductor wafer 15 that is a sample 15 is loaded from the outside of the apparatus into the sample chamber 9 through the receiving/passing opening 13 and the semiconductor loading/unloading device 10, and is installed on the stage 14.

In the example of FIG. 1, the charged particle beam apparatus 1 has, as the control device 5, a plurality of control devices 5. The control device 5 is a device that configures the controller (a controller 100 of FIG. 3) and the like of the charged particle beam apparatus 1. The control device 5 is connected by a wired cable to each portion to be driven and controlled. The control device 5 controls the operation of each portion of the electron microscope 8, the sample chamber 9, the stage 14, and the like.

In the first embodiment, the control device 5 or at least one control device 5 configures the controller 100 (FIG. 3) of the charged particle beam apparatus 1. The controller 100 controls the function as the length measurement SEM of the body device. In addition, in the first embodiment, the controller 100 also has a function of performing control related to a plurality of fans 3 (a fan control function 300 of FIG. 3).

The power supply device 7 supplies electric power necessary for the control device 5 and the components of other constituent elements. It should be noted that the power supply device 7 may be regarded as part of the control device 5. In the first embodiment, in the body cover 2 and near the side of a back surface 2b, the power supply device 7 is disposed in the lower portion, and the control device 5 is disposed in the upper portion. Without being limited to this, the device of the constituent element may be disposed at a different position in the body cover 2.

The electron microscope 8 includes known elements, such as an electron gun, a deflection coil, a converging lens, a detector, and the like. The electron microscope 8 irradiates the wafer 15 on the stage 14 with a charged particle beam b1 that is an electron beam generated from the electron gun. On the basis of this irradiation, a particle b2, such as a secondary electron and a backscattered electron, that is generated from the surface of the wafer 15 is detected as an electric signal (in other words, a detection signal) by the detector, and on the basis of the electric signal, a captured image is obtained.

The stage 14 is a sample stage and a moving stage, and is, for example, a mechanism that enables movement, rotation, tilting, and the like in a horizontal direction and a vertical direction. The sample chamber 9 including the stage 14 and the like are installed above the floor 12. In the sample chamber 9, an antivibration device and the like may be provided.

Figure 2:
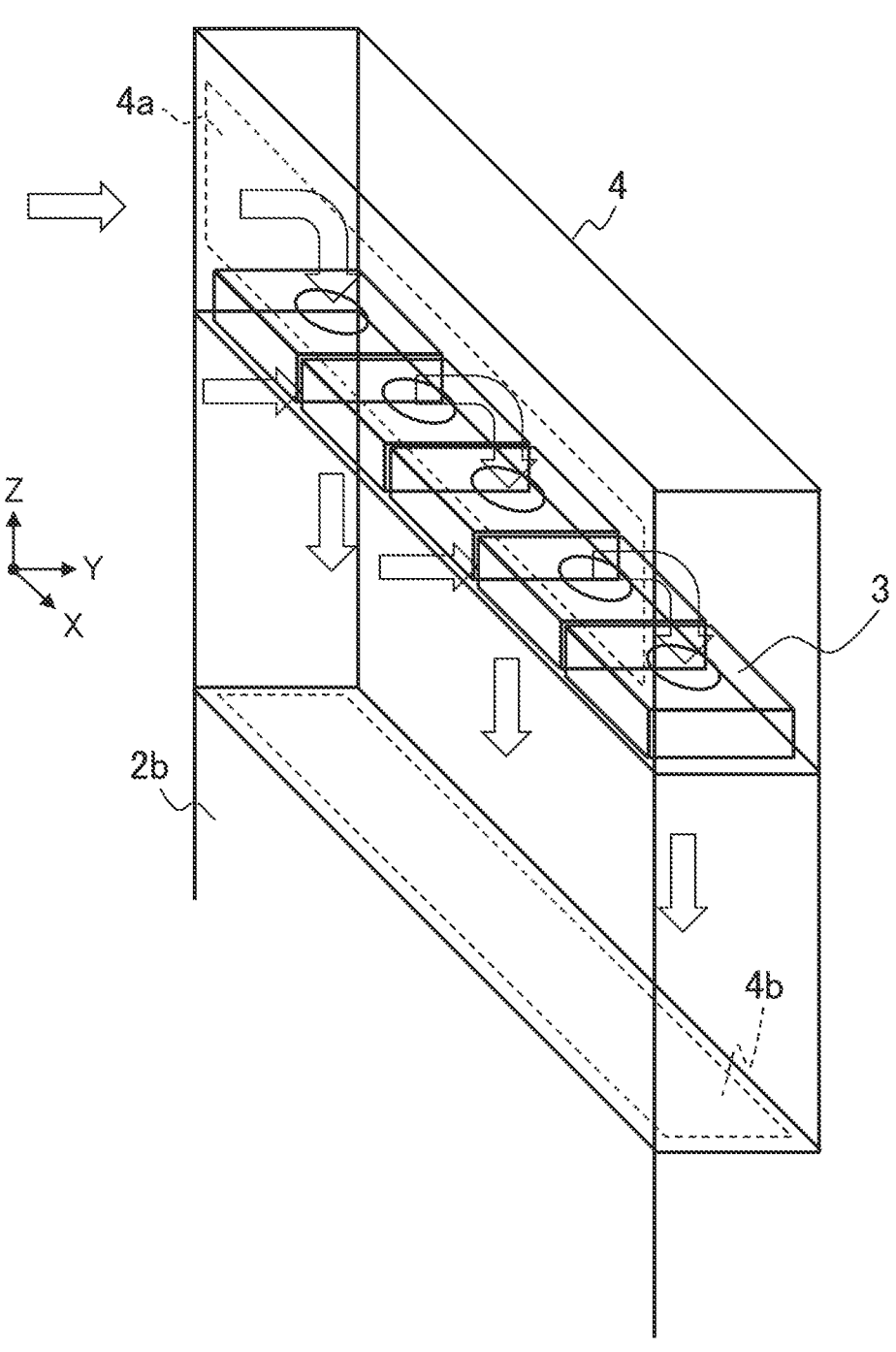
FIG. 2 is a diagram illustrating the configuration of a plurality of air blowers according to the first embodiment.

The charged particle beam apparatus 1 has the plurality of fans 3, as air blowers (in other words, exhaust fans and back surface exhaust fans) 3 for discharging, to the outside of the apparatus, heat that is generated from the interior of the apparatus, in other words, the control device 5 and the like in the interior of the body cover 2. In the first embodiment, the plurality of fans 3 are installed in a duct 4 (in other words, a back surface exhaust duct) that is provided in the upper portion on the outer side of the back surface 2b of the body cover 2. The detail is illustrated in FIG. 2 described later. The duct 4 communicates with the inner space of the body cover 2 through the ventilation hole of the back surface 2b. In the first embodiment, the plurality of fans 3 are disposed near the control device 5 so that the heat that is generated by the control device 5 can be efficiently exhausted.

The length measurement SEM has a function of performing the imaging of the semiconductor wafer by using the SEM and measuring, from the captured image, the dimension (CD) of the line width and the like of the circuit formed on the wafer. The charged particle beam apparatus 1 of FIG. 1 images the wafer 15 on the stage 14 by the electron microscope 8 on the basis of the control of the controller 100. The controller 100 measures, from the captured image, the dimension of the circuit, and stores and outputs the measurement result. The charged particle beam apparatus 1 has a function of performing such the imaging operation.

In the body cover 2, various control devices 5 for driving and controlling the electron microscope 8, the stage 14, and the like are installed. These control devices 5 generate heat according to power consumption. In releasing the heat, the respective control devices 5 should be disposed so as to be spaced from each other. However, in the case of making a design in which the respective control devices 5 are disposed such that the interval between the respective control devices 5 is large, the charged particle beam apparatus 1 is increased in size, and the site area that occupies the interior of the clean room is increased. For the clean room, clean air whose temperature and humidity are managed is required to be constantly supplied. Consequently, as the site area that is occupied by the apparatus is increased, the operation cost becomes larger. Thus, for the charged particle beam apparatus 1, size reduction and high density mounting are required to the extent possible.

However, as the size reduction and the high density mounting are accelerated, heat is more likely to be accumulated in the body cover 2, and temperature increase due to the heat inhibits the precise operation. From this, the charged particle beam apparatus 1 has a contradictory problem between the size reduction and the high density mounting and the prevention of the temperature increase and the performance lowering due to the heat.

In the charged particle beam apparatus 1 that has been subjected to the high density mounting, in order to perform the sufficient heat release and exhaustion, it is effective to perform ventilation by the fan 3 having a strong high output. However, in the charged particle beam apparatus 1, the influence of the vibration and noise of the fan 3 also becomes a problem. Vibration caused by the fan 3 and the frequency corresponding to the vibration may be close to a resonance frequency due to the natural vibration frequency of the constituent element, such as, for example, the electron microscope 8 and the stage 14. In other words, when the rotation frequency of the vibration by the rotation operation of the vane of the fan 3 is the same as or close to the natural vibration frequency of the body device, the vibration is amplified to cause resonance, thereby causing a resonance frequency. In that case, in an image captured by the electron microscope 8 (in other words, an SEM image), the influence of the vibration of the resonance appears as the shaking and noise of the signal value (for example, the brightness of the edge of the circuit pattern) in the image. The captured image becomes an image to which the shaking and noise are added, and thus, as the image for the length measurement and inspection, is lowered in accuracy and quality.

In addition, the resonance frequency of the charged particle beam apparatus 1 may cause a slight instrumental error according to the assembling and maintenance states. This is the same for the instrumental error of the fan 3 itself. Consequently, in the charged particle beam apparatus 1, the following consideration is required in the ventilation and exhaustion in the interior of the body cover 2 by the plurality of fans 3. That is, in the charged particle beam apparatus 1, the plurality of fans 3 are required to be used so as to avoid the resonance frequency of the charged particle beam apparatus 1 while an exhaust heat amount (in other words, a total exhaust amount) is kept at a constant value or more. In the charged particle beam apparatus 1, the plurality of fans 3 are required to be controlled such that the vibration due to the resonance of the fan 3 and the body device (the stage 14 and the like) is not increased, in other words, such that the shaking and the like of the captured image is within the specification value.

Figure 3:
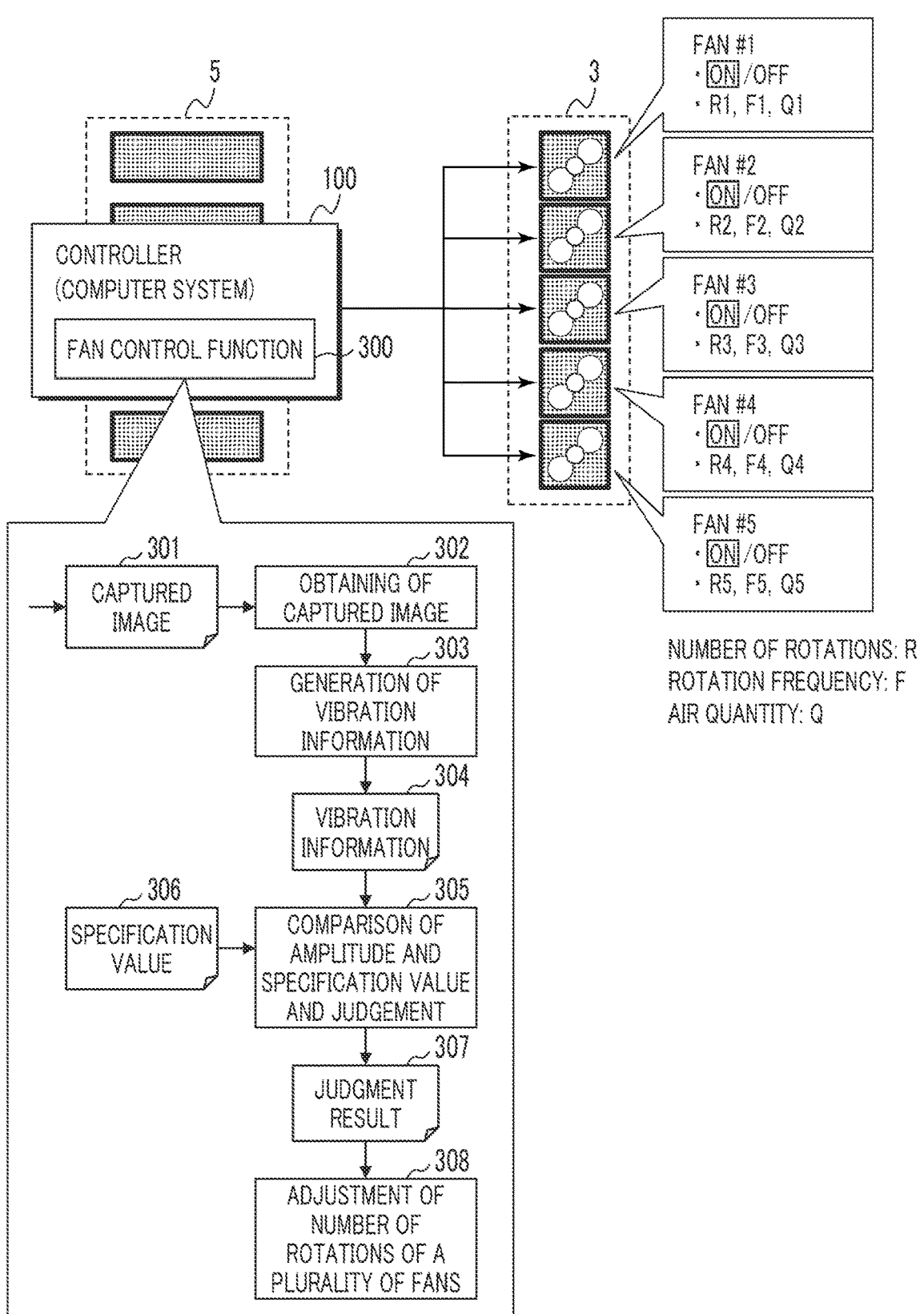
FIG. 3 is a diagram illustrating a configuration example in which the controller controls the plurality of air blowers according to the first embodiment.

The charged particle beam apparatus 1 of the first embodiment has the fan control function 300 that controls the numbers of rotations of the plurality of fans 3 by the hardware and software configurations for solving these problems, in particular, the controller 100 (FIG. 3). The detail will be descried below.

In the first embodiment, the controller 100 performs the control of the numbers of rotations of the plurality of fans 3 such that the vibration caused by the fan 3 and the resonance frequency of the body device of the charged particle beam apparatus 1 are away from each other. For that, first, in the plurality of fans 3 used for heat exhaustion, the single operation of each fan 3 is made to be able to be performed. In other words, each fan 3 of FIG. 3 is made such that the switching of the on/off state of the rotation operation can be performed on the basis of control from the controller 100. The controller 100 controls the operation of the plurality of fans 3 and each fan 3. The on state is the rotation operation state, and the off state is the stop state in which the rotation operation is not performed.

For that, in the first embodiment, for all of the plurality of fans 3, the controller 100 performs control so as to decrease the number of rotations of the fan 3 (first fan) estimated to cause the vibration, and to increase the number of rotations of the different fan 3 (second fan) (FIG. 9 and the like described later).

Configuration of Fan

FIG. 2 illustrates the configuration example of the plurality of fans 3 of FIG. 1. FIG. 2 illustrates a schematic perspective view of the vicinity of the duct 4 including the plurality of fans 3. In the first embodiment, the charged particle beam apparatus 1 has, as the plurality of fans 3, five fans 3. The number of fans 3 is not limited to this. In FIG. 2, in the duct 4, the five fans 3 are arrayed and disposed along the illustrated X axis direction (left-right direction) at the predetermined positions in the illustrated Z axis direction (up-down direction) and Y axis direction (front-back direction). In this example, the plurality of fans 3 have shafts disposed along the Z axis direction, and perform exhaustion from the up side to the down side in the Z axis direction.

Each fan 3 is, for example, an axial flow fan, but the present invention is not limited to this. In this example, a plurality of axial flow fans in which the number of rotations is relatively small, the diameter of the vane is small, and the flow rate is large are arrayed and disposed, so that apparatus size reduction, low noise, sufficient flow rate, and the like are achieved.

On the basis of the exhaustion operation of the fan 3, as indicated by the arrow, an air flow enters into the duct 4 through a ventilation hole 4a from the control device 5 side in the body cover 2 in the Y axis direction. Then, the air flow is bent to the down side in the Z axis direction, is advanced to the down side through the fan 3, and is exhausted from an opening 4b in the lower portion of the duct 4. The opening 4b includes, for example, a metal plate in which a hole of a honeycomb construction is provided, as a plate that prevents the intrusion of an electromagnetic wave.

The air that is heated by the generated heat in the power supply device 7, the control device 5, and the like in FIG. 1 flows to the up side by natural convection, enters from the back surface 2b into the duct 4, and is exhausted to the outside of the duct 4 by the plurality of fans 3.

At the time of imaging by the electron microscope 8, the interior of the sample chamber 9 is controlled to a high vacuum state. In addition, by controlling the movement of the stage 4, the position to be imaged of the target wafer 15 is positioned so as to be within the imaging field of view of the electron microscope 8. The controller 100 also controls an imaging condition, such as an imaging magnification, of the electron microscope 8.

For increasing the accuracy at the time of imaging, as described above, to prevent the movement of the stage 14 due to the thermal deformation, the temperature in the sample chamber 9 including the stage 14 is required to be suppressed from being changed and to be kept as constant as possible.

The sound wave that is generated by the rotation operation of the fan 3 propagates through the air and space in the body cover 2, gives pressure change to the component of the constituent element present in the body cover 2, and causes vibration. In particular, the resonance with other components may be increased according to the number of rotations (in other words, the rotation speed) and the frequency (in other words, the rotation frequency) of the fan 3.

Other Device Configurations

The body cover 2 of FIG. 1 has a schematically rectangular parallelepiped shape. In the body cover 2, a partition plate may be provided for controlling the air flow. For example, in FIG. 1, on the front surface side of the control device 5, a partition plate 2c is provided.

On the front surface 2a, the side surface, and the like of the body cover 2, a suction port for the air may be provided. For example, in FIG. 1, on the front surface 2a, suction ports 2d, 2e may be provided.

On the front side of the receiving/passing opening 13 of FIG. 1, a fan filter unit may be provided. The fan filter unit suctions the air in the clean room, and flows the air purified through the filter in one direction. Thus, any foreign substances can be prevented from adhering onto the wafer 15 that is loaded through the receiving/passing opening 13.

In a modification example, the charged particle beam apparatus 1 may include a different fan other than the fan 3 that is disposed outside of the body cover 2. For example, the control device 5 and the power supply device 7 in the body cover 2 may include the fan. Although the detail is not limited, each control device 5 may be a module including a mechanism including the fan and the like. For example, in each control device 5, at least one constituent element, such as an integrated circuit substrate, may be disposed in a rectangular parallelepiped shaped housing, and the housing may be provided with a suction hole, an exhaust hole, and an exhaust fan. The plurality of fans 3 of FIG. 1 become the characteristic control targets by the controller 100 in the first embodiment, but without being limited to this, other different fans may be added to the control targets.

Control of Fans by Controller

Figure 15:
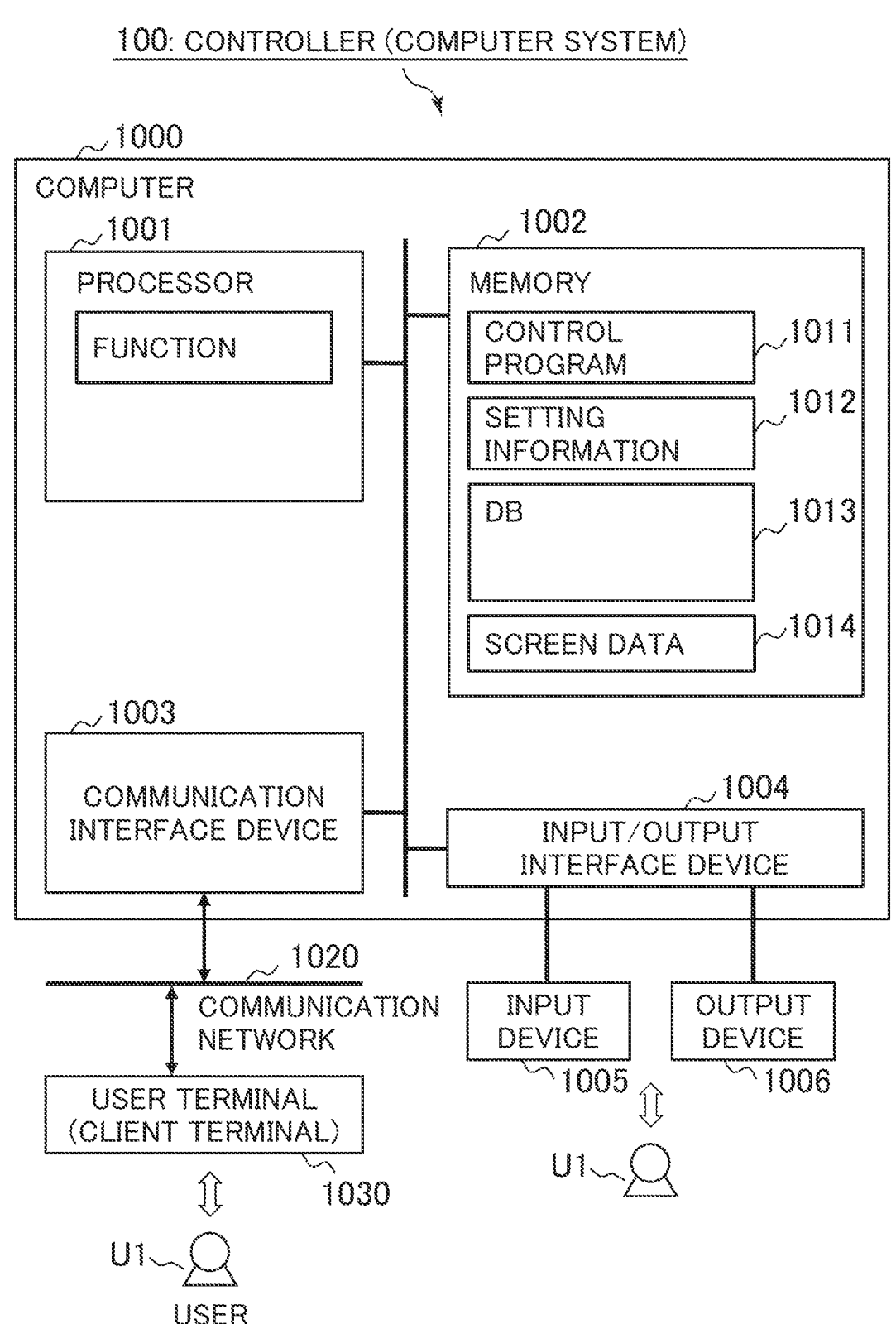
FIG. 15 is a diagram illustrating the configuration example, as a computer system, of the controller according to the first embodiment.

FIG. 3 illustrates the function block configuration of a configuration example in which the controller 100 that is configured of the control device 5 (in other words, a computer system) controls the plurality of fans 3. The controller 100 has the fan control function 300 that is achieved by the process of the processor and the like (FIG. 15 described later).

The controller 100 and the plurality of fans 3 may be electrically connected by signal wires and the like, and may be connected by wired or wireless communication. Each fan 3 may include an integrated circuit substrate and the like including a communication interface and a driving circuit.

The controller 100 gives a control signal to each fan 3, and according to the control signal, the each fan 3 is operated. Examples of the control signal include, for example, a signal that indicates the on/off of the rotation operation of the fan 3, a signal that indicates the number of rotations, and the like.

In the example of FIG. 3, the five fans 3 are fans #1 to #5 for identification and management. The controller 100 also data manages the ID, specifications, position, and the like of each fan 3. For the fan 3, the number of rotations is expressed as R. The rotation frequency is expressed as F. The air quantity is expressed as Q. In this example, the respective fans 3 (#1 to #5) have the numbers of rotations R1 to R5, rotation frequencies F1 to F5, and air quantities Q1 to Q5.

In the first embodiment, as the plurality (five) of the fans 3, products having the same model, the same specifications, and the same function and performance are used, but the present invention is not limited to this. In a modification example, the fans 3 that have different models, specifications, and the like may be mixed for use. In that case, the controller 100 data manages the different specifications and the like of the respective fans 3.

In the first embodiment, each fan 3 of the plurality of fans 3 is of the number-of-rotations variable type (FIG. 14 described later), and according to the specifications, the rotation operation at the number of rotations that is designated within the predetermined range of the number of rotations R (from the minimum number of rotations to the maximum number of rotations) is enabled. For example, for the fan #1, when the range of the number of rotations is R1 min to R1 max, the number of rotations R1 is R1 min≤R1≤R1 max. In the first embodiment, the number-of-rotations variable type is the type that can continuously vary the number of rotations within the range of the number of rotations, but the present invention is not limited to this. In a modification example, the number of rotations of the fan 3 may be of the type in which a plurality of the particular numbers of rotations that enable the operation are defined, for example, stepwise.

In FIG. 3, the controller 100 obtains a captured image 301 on the basis of the detection signal from the electron microscope 8 in the obtaining of the captured image 302, as the function block. The controller 100 generates vibration information 304 from the captured image 301 in the generation of the vibration information 303. The controller 100 compares, for example, the amplitude obtained from the vibration information 304 and the specification value related to the amplitude and obtains a judgment result 307 in the comparison of the amplitude and the specification value and judgement 305. The controller 100 performs adjustment by increasing or decreasing the numbers of rotations of the plurality of fans 3 on the basis of the judgement result 307 in the adjustment of the numbers of rotations of the plurality of fans 308.

Captured Image and Vibration Information

In the charged particle beam apparatus 1, shaking and like may be caused in the captured image of the electron microscope 8 due to some vibration.

Figure 4A:
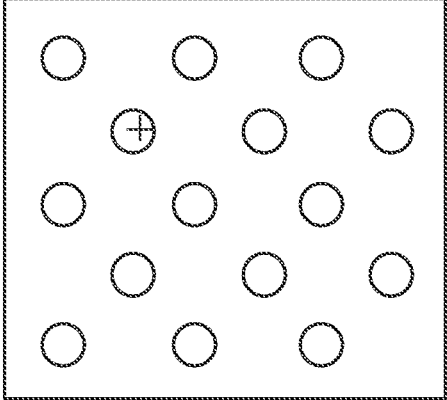
FIGS. 4A and 4B are diagrams illustrating the examples of the pattern of a sample and a captured image according to the first embodiment.
Figure 4B:
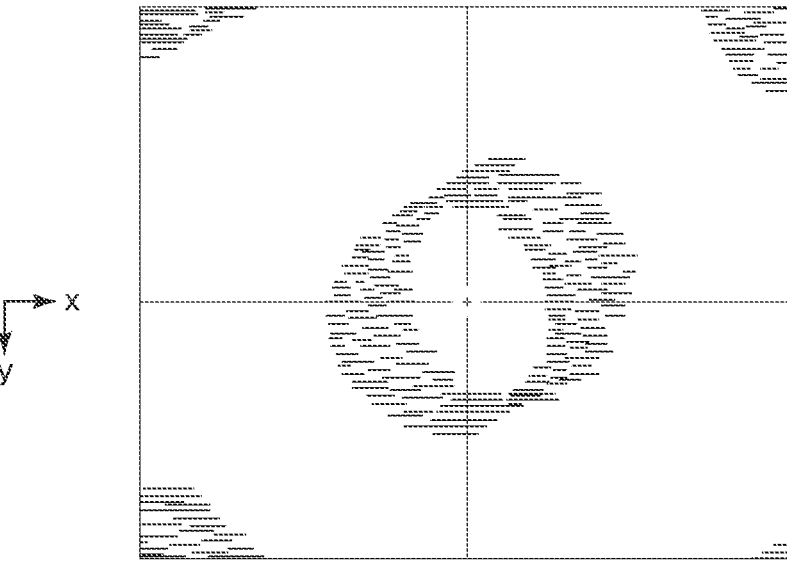

FIG. 4(B) schematically illustrates the example of the image of the case where shaking and like are caused in the captured image of the electron microscope 8 due to some vibration. FIG. 4(A) illustrates, as the example of the pattern of the wafer 15, a hole pattern having a plurality of circular holes on the wafer surface. The image of FIG. 4(B) is the example of the image obtained by imaging the hole pattern like FIG. 4(A) in top view by the electron microscope 8. It should be noted that in the actual image, with multiple tones, the background portion is dark and black, and the edge portion of the hole is bright and white, but the drawing schematically illustrates the image in which with a binary, the background is white, and the edge of the hole is black.

The charged particle beam apparatus 1 uses the sample 15 having a predetermined pattern in order to perform the detection, analysis, and the like of the vibration of the apparatus. As the predetermined pattern, the hole pattern, for example, like FIG. 4(A) can be used so that the respective vibrations can be detected, for example, in two axis directions of the X axis and the Y axis. Without being limited to this, as the predetermined pattern for the vibration detection, a line pattern and patterns having other shapes can also be used.

Figure 5:
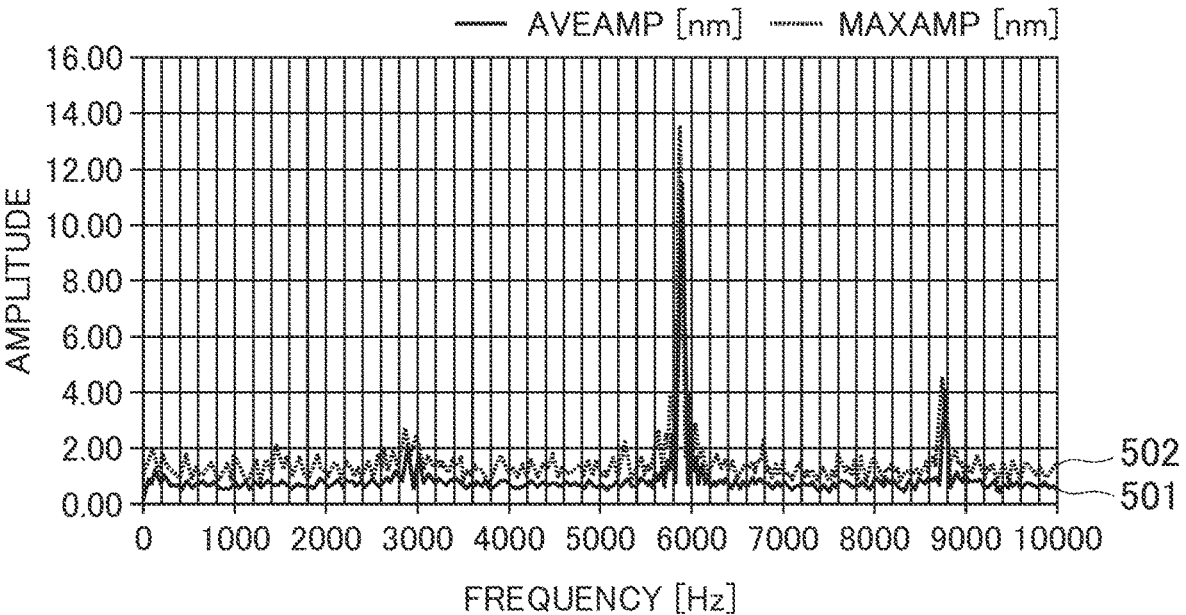
FIG. 5 is a diagram illustrating, as the example of vibration information, the example of frequency analysis result information according to the first embodiment.

FIG. 5 illustrates the example of the vibration information of the case where the shaking and the like are caused in the captured image by the electron microscope 8. The vibration information of FIG. 5 is, for example, information that can be obtained by the process on the basis of the captured image like FIG. 4(B). The example of the vibration information of FIG. 5 is the frequency analysis result information of the image of FIG. 4(B). In the graph of FIG. 5, the horizontal axis indicates the frequency, and the vertical axis indicates the amplitude, and an average value 501 and a maximum value 502 are plotted.

Figure 6:
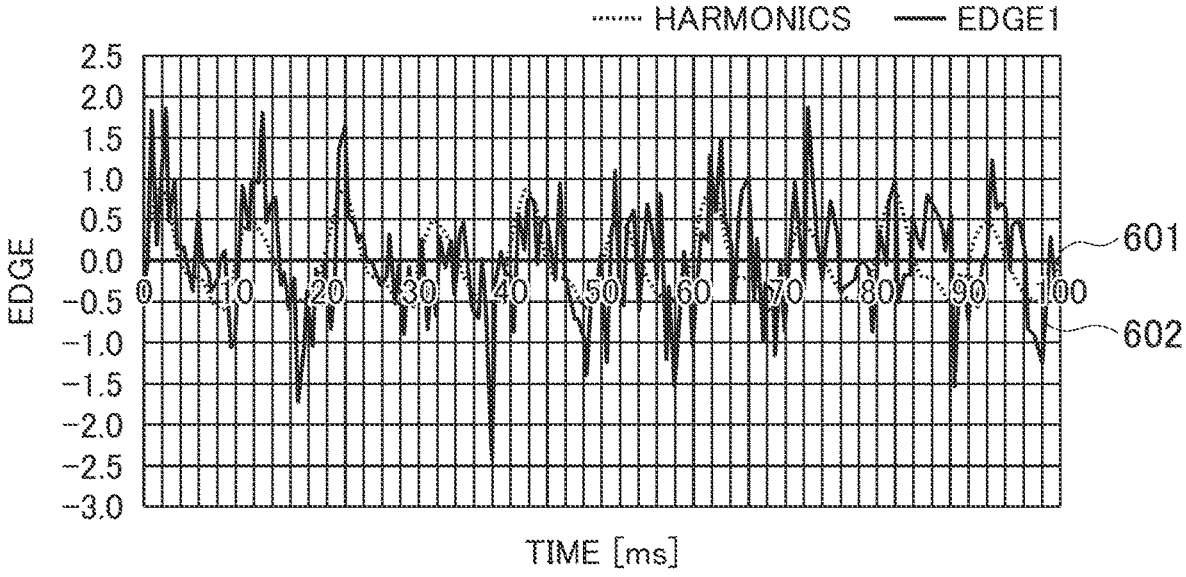
FIG. 6 is a schematic diagram illustrating the example of vibration information, the example of time waveform information according to the first embodiment.

The vibration information of FIG. 6 is similarly, information that can be obtained by the process on the basis of the captured image like FIG. 4(B). The example of the vibration information of FIG. 6 is time waveform information at the predetermined position of the image of FIG. 4(B) (for example, the edge of the hole pattern). In the graph of FIG. 6, the horizontal axis indicates time, and the vertical axis indicates the predetermined position (for example, the edge of the hole pattern), and a harmonic 601 and an edge 602 are plotted.

Figure 7:
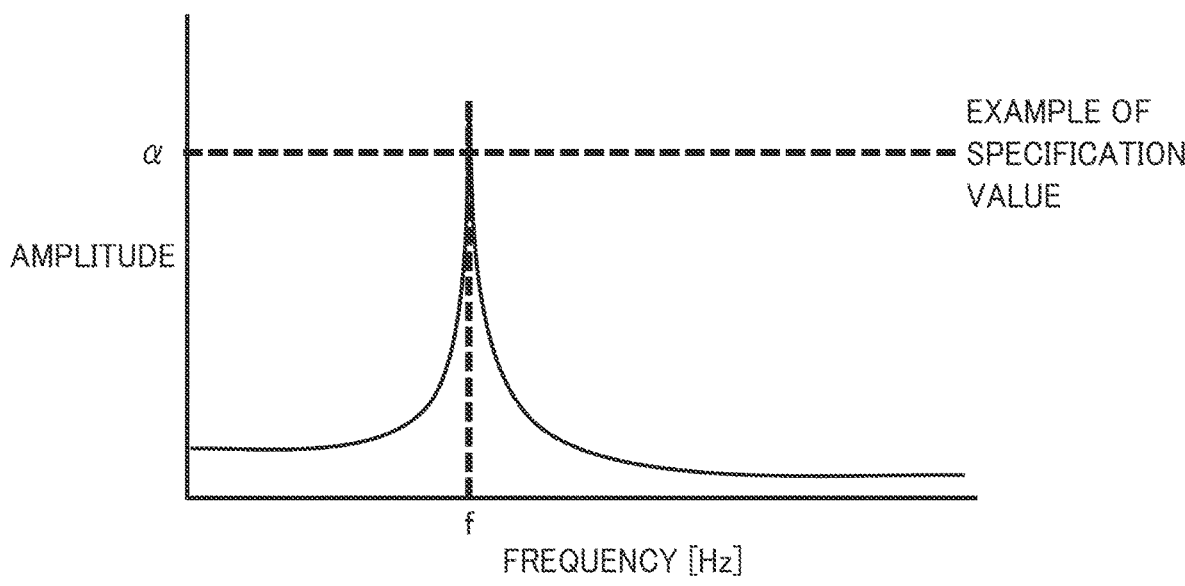
FIG. 7 is a schematic diagram of the frequency analysis result information according to the first embodiment.

The vibration information of FIG. 7 illustrates the example of the frequency analysis result information as the vibration information that is made to be schematic for simple description. The vibration information of FIG. 7 is the frequency analysis result information that is obtained from the information of the captured image that is obtained by imaging the pattern of the wafer 15 by using the electron microscope 8 when the operation of the fan 3 is made constant. In this vibration information, as the frequency characteristic, the amplitude is significantly increased at the particular frequency f [Hz]. The amplitude at the frequency f exceeds the specification value α. The specification value α is the setting example of the specification value of the amplitude in the charged particle beam apparatus.

The specification value α here is the amplitude that deteriorates the measurement value of the line width and the like of the circuit formed on the wafer 15. In other words, the specification value α is the threshold value of the amplitude by the vibration that is set corresponding to the case where the exceeding of the amplitude with respect to the degree in which the image shaking like FIG. 4(B) affects the length measurement is NG. The amplitude of the vibration information exceeds the specification value $\alpha$, which is not desired since the vibration degree is large and the measurement result and the like are deteriorated. The amplitude is equal to or less than the specification value $\alpha$, which means that the vibration degree is small and the measurement value and the like are within the allowed range.

Figure 8:
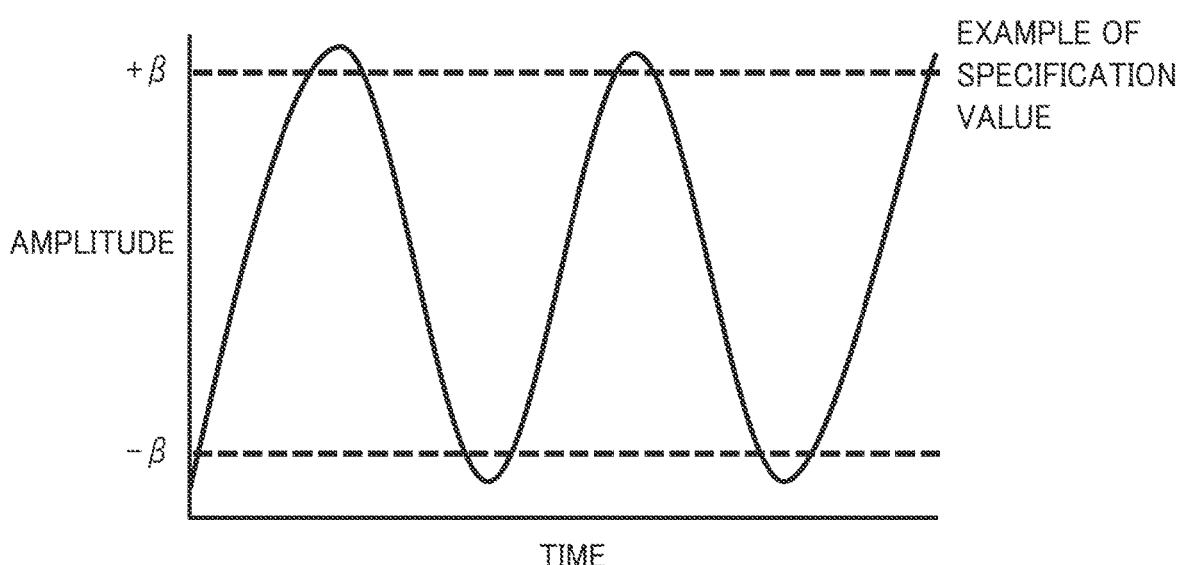
FIG. 8 is a schematic diagram of time waveform information according to the first embodiment.
Figure 9:
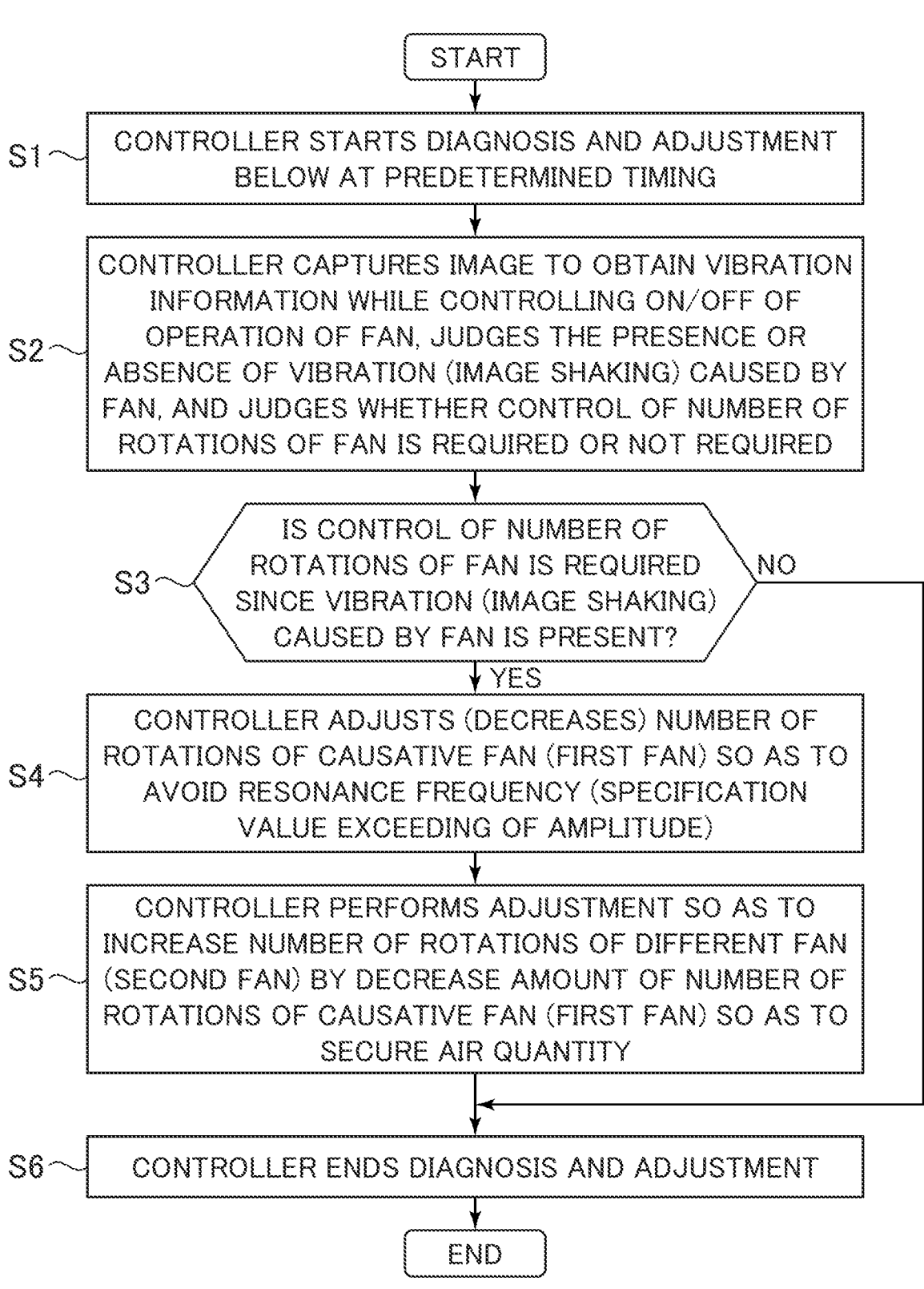
FIG. 9 is a flowchart of a basic process by a controller according to the first embodiment.

Further, the vibration information of FIG. 8 illustrates the example of the time waveform information as the vibration information that is made to be schematic for simple description. The vibration information of FIG. 8 is similarly, the time waveform information that is obtained from the information of the captured image that is obtained by imaging the pattern of the wafer 15 by using the electron microscope 8 when the operation of the fan 3 is made constant. In this vibration information, the horizontal axis indicates time, and the vertical axis indicates the amplitude at the predetermined position (for example, the edge). The specification value $\pm\beta$ is the setting example of the specification value of the amplitude at the predetermined position (for example, the edge). The amplitude exceeds the specification value $\pm\beta$, which is not desired since the vibration degree is large and the measurement result and the like are deteriorated.

In order to judge and analyze the cause of the vibration of the device that appears as the shaking in the captured image like FIG. 4(B), as one method, the judgement of the amplitude in the frequency band using the vibration information like FIGS. 5 and 7 is given. As another method, the judgement of the amplitude in the time waveform using the vibration information like FIGS. 6 and 8 is given. In the first embodiment, both methods are also applicable.

In FIG. 3, for the fan 3, the rotation frequency F of the fan 3 can be calculated from the specifications, such as the number of rotations R and the number of vanes. The controller 100 calculates the rotation frequencies F (F1 to F5) of the respective fans 3 from the information of the numbers of rotations R (R1 to R5) and the like of the respective fans 3.

According to the operation state of the fan 3, the amplitude of the vibration information may be outside the specification value (in the state where the amplitude exceeds the above specification value $\alpha$ or $\beta$) near the rotation frequency F of the fan 3. In other words, the amplitude of the vibration information may not satisfy the specifications. In that case, the fan 3 and the device of the constituent element of the charged particle beam apparatus (for example, the stage 14 and the like) are considered to be resonated. In other words, it is considered that the degree of the resonance of them is large and the vibration caused by the fan 3 appears as the shaking and the like in the captured image.

Like the examples of FIGS. 7 and 8, when for example, the amplitude of the vibration information that is obtained from the captured image at the time of operating the fan 3 exceeds the specification value, it is considered that the vibration caused by the fan 3 may be caused. In other words, the shaking and the like in the captured image may be caused due to the influence of the vibration caused by the fan 3 and the resonance with the device, such as the stage 14. In addition, for example, the amplitude of the vibration information that is obtained from the captured image at the time of stopping the fan 3 may be decreased with respect to the amplitude of the vibration information at the time of operating the fan 3. Also in the case of this decrease, it is considered that the vibration caused by the fan 3 is caused.

When the rotation frequency F of the rotation operation of the fan 3 and the device, such as the stage 14, cause resonance and the like, shaking may be caused in the signal value of the captured image due to the influence of the vibration, such as the resonance and the like. In the example of the image of FIG. 4(B), due to such the influence of the vibration, the signal value, such as the brightness that captures the circular edge of the hole pattern, causes the shaking and displacement in each direction of the illustrated x axis direction and y axis direction.

On the basis of the analysis of the vibration information of the captured image as described above, from vibration caused by the fan 3 and the influence on the shaking in the captured image due to the vibration, the controller 100 of FIG. 3 judges whether the control of the numbers of rotations of the plurality of fans 3 is required or not required.

Fan's Number-of-Rotations Control

When on the basis of the analysis of the captured image and the vibration information described above, the controller 100 estimates that the vibration is caused by the fan 3, the controller 100 performs adjustment by the variable control of the numbers of rotations of the plurality of fans 3, as described below.

First, when the charged particle beam apparatus of a comparative example includes the plurality of fans having the different numbers of rotations, the fan having the number of rotations used is selected and controlled, so that the large vibration due to the resonance frequency of the fan and the device, such as the stage, can also be avoided.

However, in such the comparative example, the resonance frequency may be close to the rotation frequency due to the instrumental error of the charged particle beam apparatus, in particular, the device, such as the stage, of the constituent element and the fan, so that the fan having the number of rotations appropriate for each charged particle beam apparatus is required to be selected. According to the instrumental error and the specifications of the number of rotations of the fan, the resonance frequency may not be avoided.

Figure 10:
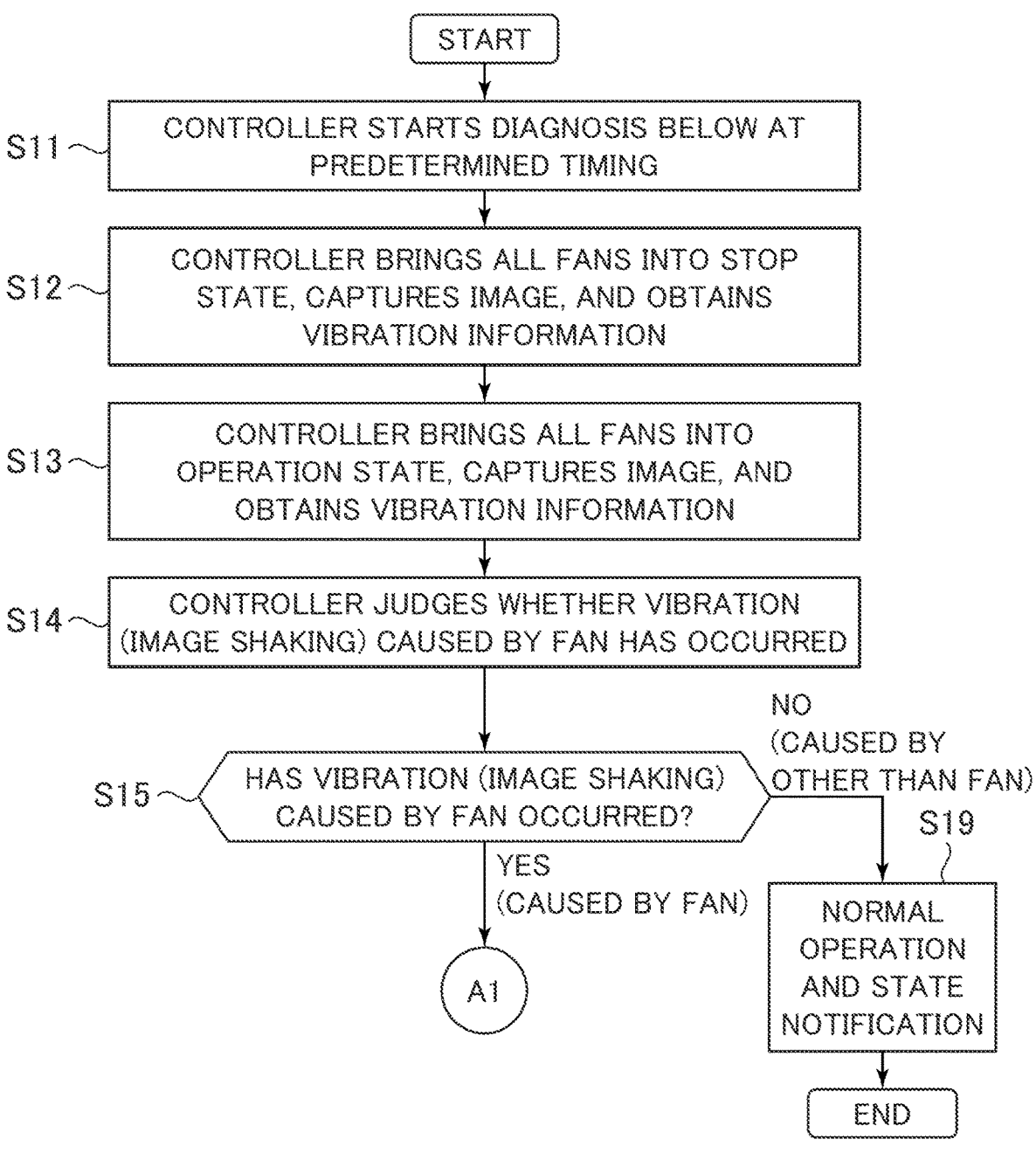
FIG. 10 is the first half part of the flowchart of a detailed process by the controller according to the first embodiment.
Figure 12:
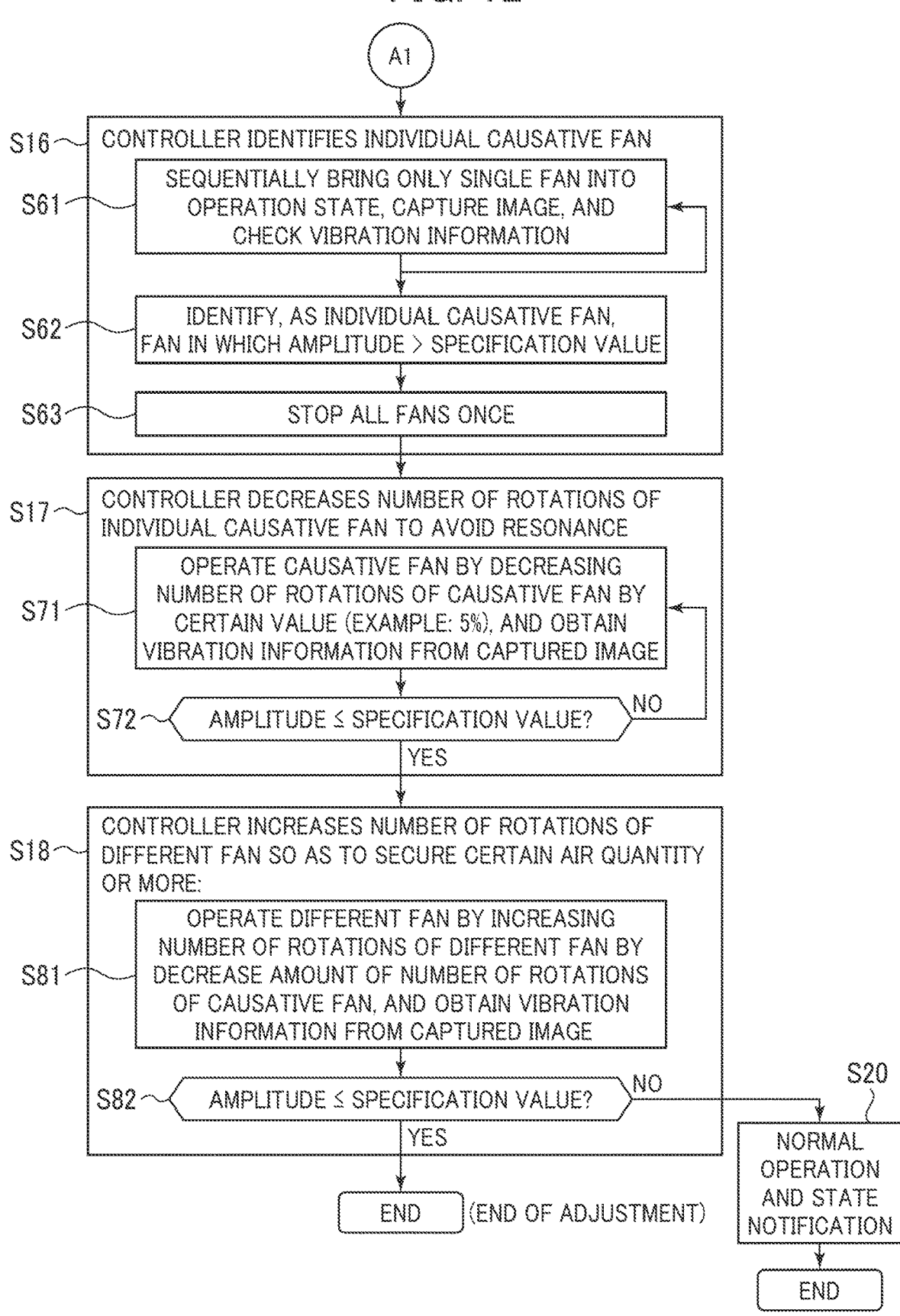
FIG. 12 is the second half part of the flowchart of a detailed process by the controller according to the first embodiment.

With respect to that, in the first embodiment, the plurality of fans 3 are made to be of the number-of-rotations variable type, and the controller 100 performs confirmation, diagnosis, and check related to the degree of the vibration and the like according to the number of rotations in the state of rotation operating or stopping all of the plurality of fans 3 or each fan 3 (FIGS. 9, 10, and 12 described later). Thus, in the first embodiment, the fan's number-of-rotations control can cope with the change in the resonance frequency due to the instrumental error of the charged particle beam apparatus 1 and the fan 3.

In addition, the fan 3 is required to be operated such that the number of rotations R of the fan 3 satisfies the specification value of the exhaust air quantity necessary for the heat exhaustion of the charged particle beam apparatus 1. When to avoid the large vibration due to the resonance, the number of rotations R of the fan 3 is decreased, the necessary exhaust air quantity is not satisfied, which is not desired. For that, in the first embodiment, when the controller 100 adjusts the numbers of rotations R of the plurality of fans 3, the controller 100 decides the number of rotations R of each fan 3 such that the total air quantity of all of the plurality of fans 3 satisfies the specification value of the necessary exhaust air quantity.

As the method for obtaining the vibration information (for example, the frequency analysis result information or the time waveform information) from the above captured image, there is a method for obtaining the vibration information in the on state where the fan 3 is rotation operated. As another method, there is a method for obtaining the vibration information in the off state where the rotation operation of the fan 3 is stopped. In the first embodiment, both methods may be applied, and both methods may be combined and applied. For example, in the flow of FIG. 10 described later, the controller 100 (FIG. 3) of the charged particle beam apparatus 1 obtains vibration information from a captured image in the state where all of the plurality of fans 3 are operated, and in addition, obtains vibration information from a captured image in the state where all of the plurality of fans 3 are stopped. The controller 100 analyzes each of those vibration information (for example, compares the amplitude and the specification value), and in addition, compares the analysis results of those vibration information.

Fan Control: Basic Flow

FIG. 9 illustrates the flow of the basic process example of the control of the plurality of fans 3 by the controller 100 of the charged particle beam apparatus 1 of the first embodiment. This flow has steps S1 to S6.

In step S1, the controller 100 starts diagnosis and adjustment below at a predetermined timing, for example, a defined timing, such as at the time of starting the charged particle beam apparatus 1, or an arbitrary timing, such as at the time of the maintenance operation. It should be noted that in the control of the charged particle beam apparatus 1, a dedicated mode that performs the diagnosis and the like (for example, a diagnosis mode) may be provided such that the controller 100 controls the switching between a normal operation mode and the diagnosis mode.

In step S2, the controller 100 obtains vibration information based on a captured image by the electron microscope 8 while controlling the on/off state of the rotation operation of each fan 3 of the plurality of fans 3. Then, the controller 100 analyzes the vibration information, specifically, compares the amplitude and the specification value, judges the presence or absence and the like of the fan 3 that causes vibration that has an influence on image shaking, and judges whether the number-of-rotations control of the fan 3 is required or not required. The detail will be described later. For the outline, the amplitude of the vibration information exceeds the specification value, the adverse influence on the length measurement due to the image shaking is large, which is NG, so that the fan control is judged to be required. In addition, the controller 100 may identify, among the plurality of fans 3, some fans 3 estimated to cause the vibration.

The fan 3 estimated to cause the vibration may be described as a causative fan (first fan). The fan 3 other than the fan 3 estimated to cause the vibration may be described as a different fan (second fan). The first fan may include two or more fans. The second fan may include two or more fans.

Step S3 is a branch according to the judgement result of step S2. When in step S3, the fan control is required (YES), the controller 100 goes to step S4, and when the fan control is not required (NO), the controller 100 goes to step S6.

In step S4, the controller 100 adjusts the number of rotations R of the fan 3 (first fan) that causes the vibration so as to avoid the resonance frequency, in other words, so as to avoid the fan 3 from having the rotation frequency in which the amplitude exceeds the specification value. The adjustment of the number of rotations R corresponds to the adjustment of the rotation frequency F corresponding to the number of rotations R. In addition, in the first embodiment, the adjustment of the number of rotations R of the first fan is, as a specific example, the decrease of the number of rotations R.

In step S5, the controller 100 adjusts the number of rotations R of the different fan 3 (second fan) by the decrease amount of the number of rotations of the above causative fan 3 (first fan) so as to secure the predetermined air quantity (the specification value of the necessary exhaust air quantity described above) in the charged particle beam apparatus 1. In a second embodiment, the adjustment of the number of rotations R of the second fan is, as a specific example, the increase of the number of rotations R.

In step S6, the controller 100 ends the above diagnosis and adjustment, and returns to the normal operation mode. The flow of FIG. 9 is repeated likewise at each predetermined timing.

In the control of the fan 3 by the controller 100 described above, a method for determining the form of the vibration information (for example, FIGS. 7 and 8) to be generated from the captured image and a method for determining the parameter (for example, the amplitude) to be compared with the specification value from the vibration information can be previously designed and set in the system including the controller 100. Alternatively, in the fan control function 300 of the controller 100, a plurality of methods may be implemented, and the method used may be able to be selected from the plurality of methods by user setting.

Fan Control: Detailed Flow

FIGS. 10 and 12 illustrate the flow of the detailed process example of the control of the fan 3 by the controller 100 in the first embodiment. The flow of FIGS. 10 and 12 is the more detailed process example based on FIG. 9. FIG. 10 is the first half part, and FIG. 12 is the second half part.

In step S11 of FIG. 10, the controller 100 starts diagnosis and adjustment below at a predetermined timing. In this example, as the predetermined timing, the diagnosis is performed at the start of the charged particle beam apparatus 1, such as, for example, once per day.

In step S12, first, the controller 100 images the pattern (for example, the hole pattern of FIG. 4(A)) of the wafer 15 by the electron microscope 8 for the diagnosis in the off state where the rotation operation of all of the plurality of fans 3 are stopped, and obtains captured image information. Then, the controller 100 obtains, from the captured image information, the vibration information of the predetermined form, for example, the frequency analysis result information. The controller 100 inspects the frequency analysis result information, compares, for example, the amplitude and the specification value, and judges whether the amplitude exceeds the specification value (for example, the $\alpha$ of FIG. 7).

Subsequently, in step S13, likewise, the controller 100 obtains captured image information by imaging the same pattern of the same wafer 15 as step S12 by the electron microscope 8 for the diagnosis in the on state where all of the plurality of fans 3 are rotation operated (as the normal operation state, the state where all of the plurality of fans 3 are made to have the number of rotations R and the rotation frequency F that are constant values). Then, the controller 100 obtains, from the captured image information, the vibration information of the same form, for example, the frequency analysis result information. The controller 100 inspects the frequency analysis result information, compares, for example, the amplitude and the specification value, and judges whether the amplitude exceeds the specification value.

It should be noted that in the process examples of steps S12 and S13 described above, due to at the time of starting the apparatus, the plurality of fans 3 are inspected in the order of the state where all of the plurality of fans 3 are stopped and the state where all of the plurality of fans 3 are operated, but the present invention is not limited to this. In a modification example, for example, in the case where the diagnosis is performed midway through the normal operation and the like, the order of the processes of steps S12 and S13 described above may be reversed and executed.

In step S14, on the basis of the judgment results of steps S12 and S13 described above, the controller 100 judges whether image shaking due to the vibration caused by the fan 3 is caused. In other words, the controller 100 performs cause classification in which at which location in the charged particle beam apparatus 1 the vibration that affects the image shaking in which the amplitude exceeds the specification value is caused, in particular, whether the vibration is caused by the fan 3 or by the device of the constituent element other than the fan 3 (the electron microscope 8, the stage 14, and the like). An example of this process is illustrated in FIGS. 11(A) and 11(B).

In step S15, on the basis of the judgment result of step S14, for example, on the basis of the judgement like FIGS. 11(A) and 11(B), when the image shaking due to the vibration caused by the fan 3 is present (YES), the controller 100 goes to step S16 of FIG. 12, and when the image shaking due to the vibration caused by other than the fan 3 (NO), the controller 100 goes to step S19.

FIGS. 11(A) and 11(B) illustrate the case classification and the like related to the vibration cause judgement of step S14. The table of FIG. 11(A) illustrates four cases (cases A to D) by the combinations of two rows of the state where all of the fans are stopped like step S12 and the state where all of the fans are operated like step S13, and two columns of the presence or absence of the image shaking. The absence of the image shaking is the case where the amplitude≤the specification value, and the presence of the image shaking is the case where the amplitude>the specification value.

The case A is the case of the absence of the image shaking in the state where all of the fans are stopped, and is OK for the length measurement (within the allowed range). The case B is the case of the presence of the image shaking in the state where all of the fans are stopped, and is NG for the length measurement (the presence of the adverse influence). The case C is the case of the absence of the image shaking in the state where all of the fans are operated, and is NG for the length measurement (the presence of the adverse influence). The case D is the case of the presence of the image shaking in the state where all of the fans are operated, and is NG for the length measurement (the presence of the adverse influence).

The table of FIG. 11(B) illustrates the cause estimation and the judgement whether the fan control is required or not required according to the combinations of the cases of FIG. 11(A). After the diagnosis information is inspected in the state where all of the fans are stopped like step S12 and the state where all of the fans are operated like step S13, the combinations like the table occur.

For example, when the case A is changed to the case C, since both are OK, the vibration cause is judged to be absent, and the control of the fan 3 is judged to be not required. For example, when the case A is changed to the case D, the OK in the state where all of the fans are stopped is changed to the NG in the state where all of the fans are operated, so that the fan 3 is estimated to cause the vibration (the image shaking corresponding to that). Thus, in this case, the control of the fan 3 is judged to be required.

For example, the state where the case B is changed to the case C and the state where the case B is changed to the case D are NG at the time of stopping all of the fans, so that the vibration is judged to be caused by the constituent element other than the fan, and the control of the fan 3 is judged to be not required. It should be noted that in the case of the NG of the case B in the state where all of the fans are stopped, the controller 100 may judge that other than the fan 3 causes the vibration, even without being required to inspect the vibration cause in the state where all of the fans are operated.

The cause judgement example of FIGS. 11(A) and 11(B) is the classification example of whether the vibration is caused by the fan 3 among all of the plurality of fans 3 or by the constituent element other than the fan 3, and the more detailed cause estimation of each fan 3 will be described later.

Returning to FIG. 10, when the controller 100 goes to step S19 since the vibration is caused by other than the fan 3, the controller 100 performs setting so as to return the operation state of the plurality of fans 3 to the state where the rotation operation of all the fans 3 is performed (that is the same as step S13) like at the time of the normal operation. Then, the controller 100 performs output notifying, to a user, the current state of the fan 3. For example, the controller 100 notifies, to the user, that the vibration (the image shaking corresponding to that) is caused by other than the fan 3, that the adjustment of the number of rotations by the fan control function 300 is not performed, that the replacement of the fan 3 itself is not required, and the like. The notification may be performed by screen display, voice output, lamp illumination, mail sending, and the like. The user can confirm the current state by the received notification. After step S19, this flow is ended.

After step S15, when the vibration is caused by the fan 3 (YES), the individual causative fan that mainly causes the vibration is required to be identified. In step S16 of FIG. 12, the controller 100 identifies the individual fan 3 (individual causative fan) that mainly causes the vibration. Specifically, step S6 has steps S61 to S63.

In step S61, the controller 100 sequentially brings only the single fan 3 into the on state where the single fan 3 is rotation operated, and likewise obtains and confirms the vibration information from the captured image. For example, at first, only the fan #1 of FIG. 3 is brought into the rotation operation state (on state) and the different fans #2 to #5 are brought into the stop state (off state), so that the imaging is performed. Next, only the fan #2 is imaged in the on state, and likewise, the image of only the fan #3 in the on state, the image of only the fan #4 in the on state, and the image of only the fan #5 in the on state are obtained.

In step S62, the controller 100 identifies the fan 3 corresponding to the condition in which the amplitude exceeds the specification value, as the individual fan that causes the vibration (individual causative fan), on the basis of the vibration information of the captured image in each state obtained in step S61. The process operations like steps S61 and S62 are executed likewise by the number of the plurality of fans 3, so that all of one or more individual causative fans 3 can be identified. After the individual causative fan is identified, in step S63, the controller 100 brings all the fans 3 into the stop state once.

The parameter of the amplitude and the specification value used for identifying the individual causative fan in step S16 is not limited to the example of FIG. 7 and the like described above, and the following is also applicable. That is, as the parameter, one or two or more of the rotation frequency F of the fan 3 used in the charged particle beam apparatus 1, the natural vibration frequency of the component of the predetermined constituent element that may be vibrated due to the fan 3, and the number of vibrations calculated from the previously obtained image data may be used.

In the identification of the individual causative fan in step S16, without being limited to the method of step S61, only the single fan 3 among the plurality of fans 3 may be stopped, the different fan 3 may be operated, and the vibration information of the captured image may be confirmed.

Next, in step S17, the controller 100 decreases the number of rotations R of the fan 3 identified as the above individual causative fan, and thus avoids the resonance frequency with the device of the constituent element of the charged particle beam apparatus 1 (for example, the stage 14 and the like). In other words, the controller 100 decreases the rotation frequency R of the individual causative fan, and thus avoids the large vibration such that the amplitude exceeds the specification value. Specifically, step S17 has steps S71 to S72.

In step S71, the controller 100 attempts to decrease the number of rotations R of the individual causative fan (for example, assumed as the fan #1) by the constant value (for example, as the constant change amount, 5%) to operate the individual causative fan, and obtains the vibration information from the captured image. The constant value (or the constant change amount) in this case is the setting value in the control, and is not necessarily required to be expressed in terms of percent.

In step S72, the controller 100 confirms the vibration information, and confirms whether the amplitude is held to be the specification value or less. When the amplitude is not held to be the specification value or less (NO), the controller 100 returns to step S71, and likewise, the controller 100 further decreases the number of rotations R of the individual causative fan (for example, the fan #1) by the constant value (for example, 5%) to operate the individual causative fan, obtains the vibration information from the captured image, and in step S72, likewise, confirms whether the amplitude is held to be the specification value or less. The controller 100 likewise repeats the processes in steps S71, S72, and decreases the number of rotations R of the individual causative fan until the amplitude is held to be the specification value or less.

It should be noted that in step S17, when the number of rotations R of the individual causative fan is decreased, the limit and condition in varying the number of rotations R, in addition to the range of the number of rotations in the specifications, may be set and used. For example, the change amount in decreasing the number of rotations R of the individual causative fan may be allowed to be decreased to −20% on the basis of the rule of the air blower described later. Alternatively, the upper limit value and the lower limit value within the range of the number of rotations may be used.

In addition, when from the result of step S16, two or more individual causative fans are present, the controller 100 likewise decreases the number of rotations R of each individual causative fan. For example, when two individual causative fans having the same specifications are present, the decrease amounts of the numbers of rotations R of those are made to be equal.

Next, in step S18, the controller 100 performs adjustment so as to increase the number of rotations R of the different fan 3 (second fan) by the decrease amount of the number of rotations R of the above individual causative fan (first fan) so as to secure the predetermined air quantity (the specification value of the necessary exhaust air quantity) or more in the specifications of the charged particle beam apparatus 1. Specifically, step S18 has steps S81 to S83.

In step S81, the controller 100 obtains the vibration information from the captured image in the state where the number of rotations of at least one different fan 3 (second fan) is increased by the decrease amount of the total number of rotations R of at least one individual causative fan (first fan). The total air quantity of all of the plurality of fans 3 after the varying of the number of rotations is decided to be equal to or more than the value of the air quantity in the specifications of the charged particle beam apparatus 1 before the varying of the number of rotations. It is preferable that the total air quantities before and after the varying be made to be equal, but when this is difficult, the total air quantity may slightly exceed the necessary exhaust air quantity.

In step S82, the controller 100 confirms the vibration information from the captured image after the adjustment, and confirms whether the amplitude is held to be the specification value or less. When the amplitude is held to be the specification value or less (YES), this means that the adjustment by the fan control function 300 is successful, and this flow is ended. When the amplitude is not held to be the specification value or less (NO), the controller 100 goes to step S20.

It should be noted that in step S81, for the method for increasing the number of rotations of the different fan 3 (second fan), there is one method by which when two or more fans 3 corresponding to the second fans are present, the numbers of rotations R of all of those fans 3 are separately increased by the same amount, but the present invention is not limited to this. Another method by which when two or more fans 3 corresponding to the second fans are present, the numbers of rotations R of only some fans 3 among them are increased may be used. When the total air quantity can be secured at the constant value or more, any method may be used.

In addition, in FIG. 12, the case where step S17 and step S18 are sequentially performed has been described, but the present invention is not limited to this. For example, a method for confirming the vibration information from the captured image by performing control in the combination of step S17 and step S18 so as to decrease the number of rotations of the causative fan (first fan) by the constant amount and to increase the number of rotations of the different fan (second fan) by the constant amount may be applied.

In step S20, the controller 100 performs setting so as to return the operation of the plurality of fans 3 to the rotation operation state at the time of the normal operation, and performs output notifying, to the user, the current state of the fan 3. For example, the controller 100 notifies, to the user, that the vibration (the image shaking due to that) is caused by the fan 3, that the adjustment of the number of rotations by this fan control function is not performed, that the replacement of the fan 3 itself is recommended, and the like. After step S20, this flow is ended.

As in the above flow, in the first embodiment, the number of rotations of the fan 3 estimated to cause the vibration is decreased, so that the resonance frequency on the charged particle beam apparatus 1 side is avoided, and the number of rotations of the fan 3 other than that is increased to secure the exhaust air quantity of the charged particle beam apparatus 1 at the constant value or more. Thus, the shaking that appears in the captured image due to the influence of the vibration of the fan 3 can be suppressed, and the temperature in the body cover 2 can be stabilized.

Detail of Fan's Number-of-Rotations Control

The detailed process example of the fan's number-of-rotations control of steps S17 and S18 of FIG. 12 will be described. In steps S17, S18, the controller 100 performs the control and adjustment of the numbers of rotations R of the plurality of fans 3 so as to satisfy the following condition equations according to the rule of the air blower.

The condition equations that are related to the relationship between the number of rotations R and the air quantity Q of the fan 3 are as follows.

$$Qall=Q1+Q2+\ldots+Qn=AV1 \text{ (example: } n=5\text{)} \quad \text{Condition equation 1}$$

$$Qn'=Rn'/Rn\times Qn \ (0.8Rn\leq Rn'\leq 1.2Rn) \quad \text{Condition equation 2}$$

To make the total exhaust air quantity of the charged particle beam apparatus 1 constant (also described as the necessary exhaust air quantity AV1), the condition equation 1 expresses that the sum (total air quantity: Qall) of the air quantities (Q1 to Qn) of the respective fans 3 is made to be constant (AV1). On the other hand, the target parameter of the variable control in the first embodiment is the number of rotations R of the fan 3.

The condition equation 2 expresses the proportion relationship between the number of rotations R and the air quantity Q of the fan 3 on the basis of the rule of the air blower. Rn is the number of rotations before the varying, Rn' is the number of rotations after the varying, Qn is the air quantity before the varying, and Qn' is the air quantity after the varying. The known rule of the air blower is the rule in which when the amount that changes the number of rotations of the fan is within ±20%, the characteristic of the fan is changed according to the proportion rule, as follows. 1. The air quantity is proportional to the number of rotations. 2. The wind pressure is proportional to the square of the number of rotations. 3. The axis power is proportional to the cube of the number of rotations. 4. When the speed and the air quantity of the fan are constant, the wind pressure and the power are proportional to the density of the air.

The controller 100 performs adjustment by varying the number of rotations R of each fan 3 of the plurality of fans 3 within the range that satisfies the condition equation 2. The controller 100 decides the number of rotations R of each fan 3 within the range that satisfies the condition equation 1. The controller 100 performs adjustment so that the amplitude of the vibration information is held to be the specification value or less within the ranges that satisfy the condition equation 1 and the condition equation 2.

It should be noted that when even in the control within the ranges that satisfy the condition equation 1 and the condition equation 2, the amplitude of the vibration information is not held to be the specification value or less, which means the result in which this fan control function 300 cannot sufficiently reduce the image shaking due to the influence of the vibration caused by the fan 3. Consequently, like step S20 described above, the controller 100 performs notification in which for example, the replacement of the fan 3 is recommended. FIGS. 13(*a*), 13(*b*), and 13(*c*) illustrate explanatory views of the adjustment of the number of rotations R and the air quantity Q of the fan 3 according to the above condition equations. By way of example, FIG. 13(*a*) illustrates the states of the plurality of fans 3 (#1 to #5) before the adjustment, and FIG. 13(*b*) illustrates the states of the plurality of fans 3 (#1 to #5) after the adjustment. Before the adjustment, for the respective fans #1 to #5, the numbers of rotations R1 to R5 are the same number of rotations RA, and the respective air quantities Q1 to Q5 are the same air quantity QA. The number of rotations RA and the air quantity QA are the constant values at the time of the normal operation. Qall=Q1+ . . . +Q5=QA×5=AV1

After the adjustment, for example, when the fan #1 is estimated as the individual causative fan (first fan) for the vibration, the number of rotations R1 (RA) of the fan #1 is decreased to the number of rotations RB. The number of rotations RB is the decreased value after the adjustment (RB<RA). Correspondingly, the air quantity QB is the decreased value after the adjustment (QB<QA). In addition, for the fans #2 to #5 (second fans) other than the fan #1, for example, the numbers of rotations R2 to R5 (RA) are respectively increased to the number of rotations RC. The number of rotations RC is the increased value after the adjustment (RC>RA). Correspondingly, the air quantity QC is the increased value after the adjustment (QC>QA). When the change amount of the decrease of the number of rotations R is X %, RB=Ra×(100−X %), and when the change amount of the increase of the number of rotations R is Y %, RC=Ra×(100+Y %).

For example, when the number of rotations R1 (RA) of the fan #1 is decreased by 20% (X=20%), the numbers of rotations R2 to R5 (RA) of the fans #2 to #5 that are the different fans are increased by 20% in total (Y=5%). The air quantity Q of each fan 3 is changed according to the change in the number of rotations R of the each fan 3, but the all air quantity Qall is made constant (AV1) before and after the adjustment. Qall=QA×5=QB+QC×4=AV1

FIG. 13(*c*) illustrates another example of the adjustment. In the example after the adjustment of FIG. 13(*c*), for example, when the fan #1 is estimated as the individual causative fan (first fan) for the vibration, the number of rotations R1 (RA) of the fan #1 is decreased to the number of rotations RB. In addition, for the fans #2 to #5 (second fans) other than the fan #1, only one fan, for example, only the fan #2, is selected, and the number of rotations R2 (RA) of the fan #2 is increased to the number of rotations RD. The number of rotations RD is the increased value after the adjustment (RD>RA). Correspondingly, the air quantity QD is the increased value after the adjustment (QD>QA). The fans #3 to #5 have the same number of rotations R and the same air quantity Q as before the adjustment. The all air quantity Qall is made constant (AV1) before and after the adjustment. Qall=QB+QD+QA×3=AV1

It should be noted that FIG. 12 illustrates the example in which the adjustment is performed by varying the number of rotations R by the constant value (%) in step S17, but the present invention is not limited to this, and the controller 100 may calculate and decide the number of rotations R and the air quantity Q after the adjustment on the basis of the calculation as described above.

About Type of Fan

As the fan 3 included in the charged particle beam apparatus 1, the fan of the number-of-rotations fixed type and the fan of the number-of-rotations variable type will be described. FIG. 14 illustrates an explanatory view of the types of the fans 3. In the first embodiment, the five fans 3 as the plurality of fans 3 included in the charged particle beam apparatus 1 of FIG. 1 have the same model, specifications, and the like, and the number-of-rotations variable type that can continuously vary the number of rotations R within the predetermined range is applied.

The table of FIG. 14 schematically illustrates the specifications of the fans 3 of some models (that are assumed to fans A, B, C here). In this table, as the specification values of the fan 3, there are the model, the type of the number of rotations, the number of rotations, the electric current, the rotation speed, the rotation frequency, the maximum air quantity, the maximum static pressure, the noise level, the ambient temperature used, the life (service life), and the like. In this example, the fans A, B are of the number-of-rotations fixed type, and the fan C is of the number-of-rotations variable type.

For the configuration of the fan 3 of the charged particle beam apparatus 1, given is one solution for suppressing the influence on the SEM image due to the vibration and noise of the fan 3 (for example, the image shaking like FIG. 4 described above) in which the fan 3 included in the charged particle beam apparatus 1 is changed to the type that decreases the number of rotations of the fan 3, thereby reducing the vibration of the fan 3. For example, the change from the type A to the type B in the number-of-rotations fixed type is given. In this change, the number of rotations: Ra>Rb, and the noise level: La>Lb.

In addition, when the number of rotations R of the fan is decreased, the air quantity Q of the fan is also decreased, so that to secure the air quantity (the necessary exhaust air quantity AV1) of the charged particle beam apparatus 1, the number of fans 3 included in the charged particle beam apparatus 1 (for example, the fan B) is increased, which is one solution. However, increasing the number of fans 3 included in the charged particle beam apparatus 1 leads to, for example, making the charged particle beam apparatus 1 larger, which is not desirable.

In addition, also in the type B after the change, the rotation frequency Fb of the fan 3 is close to the natural vibration frequency of the device of the constituent element of the charged particle beam apparatus 1 (for example, the stage 14 and the like), and resonance may also be caused to make the vibration large.

Accordingly, to be able to cope with even the case where such the resonance can be caused, in the first embodiment, like the type C, the fan 3 of the number-of-rotations variable type is applied. Then, in the first embodiment, as described above, the number-of-rotations variable control of the plurality of fans 3 based on the vibration information of the captured image is performed, so that the avoidance of the resonance and the securing of the total air quantity are achieved. Thus, the image shaking due to the influence of the vibration caused by the fan 3 can be prevented and reduced, and the imaging, inspection, and the like at high accuracy are enabled.

In addition, in the first embodiment, the plurality of fans 3 of the number-of-rotations variable type are controlled to confirm whether the amplitude of the vibration information is held to within the specification value, which can cope also with the influence of the vibration due to the instrumental error and variation of the charged particle beam apparatus 1 and the fan 3.

In addition, conventionally, after the noise and image shaking are caused, the replacement of the fan is studied, and in the replacing of the fan, the replacing operation of the fan by an operator is required after the entire charged particle beam apparatus is stopped. On the contrary, in the first embodiment, at the time of the normal operation or arbitrary maintenance and inspection and the like of the charged particle beam apparatus 1, the controller 100 diagnoses and checks the influence on the image shaking and the causative fan on the basis of the vibration information of the captured image with respect to the fan 3 of the number-of-rotations variable type. Then, in the first embodiment, the adjustment of the number of rotations of the causative fan and the different fan can be automatically executed, and thus, the image shaking can be prevented and reduced. Thus, the replacing component cost can be reduced, the manual operation can be reduced, and the remote maintenance and replacement with respect to the charged particle beam apparatus 1 are also enabled.

Computer System

FIG. 15 illustrates the configuration example, as the computer system, of the controller 100 of FIG. 3. The computer system of FIG. 15 has a computer 1000, an input device 1 and an output device 1006 that are externally connected to the computer 1000, and a client terminal device 1030 that is connected via a communication network 1020 to the computer 1000. A user U1, such as a manager, manages and operates this computer system. The user U1 uses the function of this computer system by operating the input device 1005 and the output device 1006 or the client terminal device 1030.

The computer 1000 includes a processor 1001, a memory 1002, a communication interface device 1003, an input/output interface device 1004, and the like, and they are mutually connected via buses and the like. The processor 1001 is configured of a semiconductor device, such as, for example, a CPU, ROM, and GPU, and the like. The memory 1002 is configured of a non-volatile storage device, an auxiliary storage device, and the like. The communication interface device 1003 includes a communication interface corresponding to the communication network 1020 and the like. To the input/output interface device 1004, the input device 1005 and the output device 1006 are connected.

The memory 1002 stores, for example, a control program 1011, setting information 1012, a database (DB) 1013, screen data 1014, and the like. The control program 1 is a computer program that achieves the predetermined function, such as the fan control function 300 of FIG. 3. The processor 1001 achieves the predetermined function as an execution module by executing the process according to the control program 1011 read from the memory 1002. The setting information 1012 is system setting information and user setting information related to the control program 1011. The DB 1013 stores, for example, the data of the captured image of the SEM, the history information of the operation and control of the fan 3, and the like. The screen data 1014 is, for example, data, such as a Web page, configuring a GUI screen described later.

For example, the user U1 can use the fan control function 300 of the controller 100 by operating the input device 1005 and viewing the GUI screen displayed on the output device 1006, but the present invention is not limited to this, and as described later, the fan control function 300 may be remotely used by operating the client terminal device 1030.

User Interface

Figure 16:
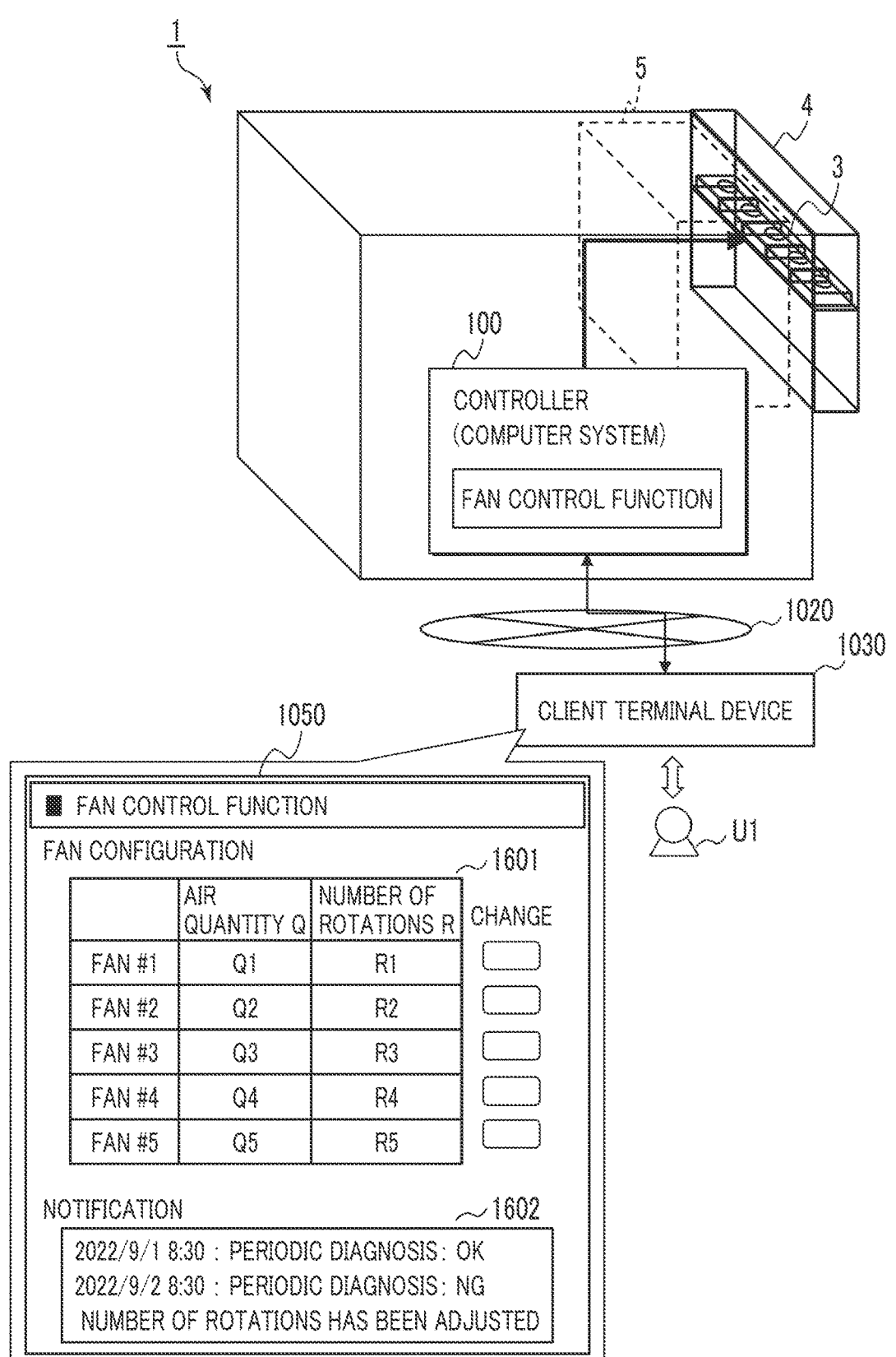
FIG. 16 is a diagram illustrating a configuration example in which an external client terminal device is connected to the controller and the example of a GUI screen according to the first embodiment.

FIG. 16 illustrates the configuration example of the user interface of the fan 3 of the charged particle beam apparatus 1 of FIG. 1 and the fan control function 300 of the controller 100 of FIG. 3. In the configuration example of FIG. 16, the client terminal device 1030 that becomes the user interface by communication via the communication network 1020

(for example, LAN) is connected to the controller 100 configured of the control device 5 of the charged particle beam apparatus 1. Then, the controller 100 provides, to the client terminal device 1030, a GUI screen 1050 related to the fan control function 300. The client terminal device 1030 displays, on its own display, the GUI screen 1050. The user U1 can perform instruction and setting related to the fan control function 300 by viewing the GUI screen 1050, and in addition, can receive the above notification.

FIG. 16 also illustrates the display example of the GUI screen 1050. This GUI screen 1050 has a fan configuration column 1601 and a notification column 1602. The fan configuration column 1601 displays the configuration information of the plurality of fans 3, for example, the setting values of the air quantity Q and the number of rotations R for each fan 3. In addition, the user U1 can change the configuration and setting values of each fan 3 by operating the change button.

The notification column 1602 displays the information of the notification from the fan control function 300 to the user U1. For example, the notification of the execution result (OK/NG) of the periodic diagnosis and the case where the number of rotations is adjusted. The notification column 1602 also displays the notification like steps S19 and S20 described above, as needed.

Besides, on the GUI screen 1050, a graph and the like in time series of the parameter, such as the number of rotations and the air quantity, may be displayed.

In addition, as another configuration example, in the clean room, a device, such as a PC, for maintenance, may be connected to the controller 100 by communication on the outer side of the body cover 2. The user U1 can perform the operation, such as the maintenance, by viewing the GUI screen 1050 displayed on the device.

Effects etc.

As described above, according to the charged particle beam apparatus 1 of the first embodiment, the temperature increase in the body device covered by the body cover 2 can be prevented, and the lowering of the apparatus performance, for example, the quality of the captured image, due to the influence of the vibration and noise by the fan 3, can be prevented. Thus, for example, the precise operation of the semiconductor processing apparatus and the like can be achieved, and the lowering of the accuracy and quality of the imaging, inspection, and the like can be prevented. In addition, according to the first embodiment, the operation of the maintenance and replacement of the fan 3 can be assisted.

Modification Example of First Embodiment

As modification examples of the first embodiment, the followings are also enabled. As the modification example, the plurality of fans 3, as the fans 3 of the number-of-rotations variable type, are not limited to the type that can continuously vary the number of rotations, and the ones of the type in which the number of rotations is selected from some values to be able to be varied stepwise may be used.

As the modification example, as the plurality of fans 3, the plurality of fans 3 having different specifications, such as the different fixed number of rotations and the range of the different number of rotations, can also be mixed.

In the first embodiment, in step S61 of FIG. 12, each fan 3 is brought into the on state, and the diagnosis and check related to the cause of the resonance are performed. Without being limited to this, a configuration in which each fan 3 is brought into the off state, and the diagnosis and check related to the cause of the resonance is performed is also enabled likewise.

Second Embodiment

Figure 17:
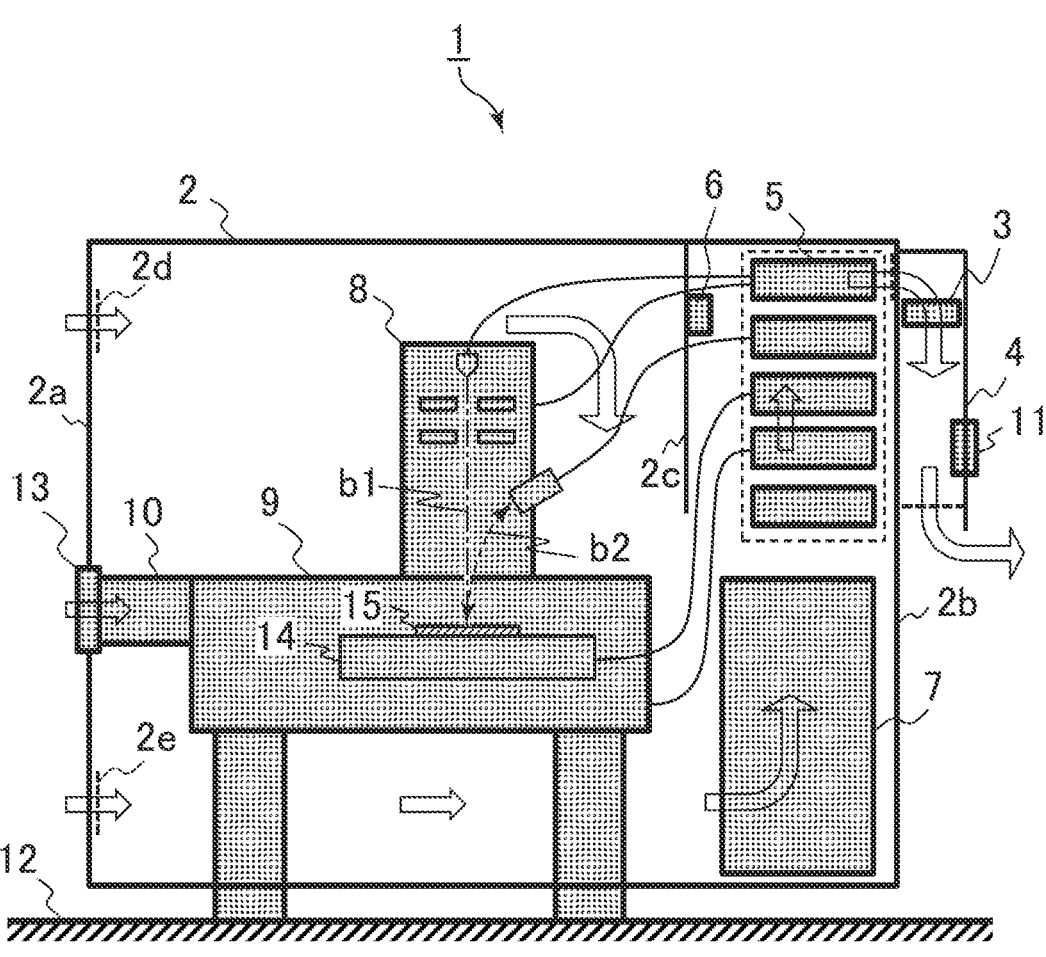
FIG. 17 is a diagram illustrating the configuration of the charged particle beam apparatus according to a second embodiment.

With reference to FIG. 17 and thereafter, the charged particle beam apparatus of a second embodiment will be described. The basic configuration of the second embodiment and the like is the same as and shared with the first embodiment, and hereinbelow, the configuring portions in the second embodiment and the like different from the first embodiment will be mainly described.

In the second embodiment, the controller 100 confirms whether the condition in which the change amount of the number of rotations in the rule of the air blower is ±20% is satisfied, and when the condition is not satisfied, the controller 100 performs additional control by using a temperature sensor. In the second embodiment, the controller 100 automatically performs such the control and adjustment.

In the first embodiment described above, the total air quantity is controlled so as to be constant with the varying of the number of rotations of the fan, so that the temperature in the charged particle beam apparatus 1 is stabilized. However, as described above, from the rule of the air blower, unless the change amount of the number of rotations is within ±20%, the air quantity cannot hold the proportion relationship with the number of rotations.

For that, in the second embodiment, the case where the change amount of the number of rotations R exceeds ±20% by the variable control of the number of rotations of the fan is also assumed, and the specification value is provided also for the temperature in the charged particle beam apparatus 1, specifically, the temperature in the body cover 2. Then, the controller 100 confirms whether the temperature value of the temperature sensor satisfies the specification value even when the change amount of the number of rotations R exceeds ±20%, and when the temperature value of the temperature sensor satisfies the specification value, the controller 100 determines that the control is effective.

FIG. 17 illustrates the configuration of the charged particle beam apparatus 1 of the second embodiment. The configuration of FIG. 17 is different from the configuration of FIG. 1 in that a temperature sensor 6 is installed in the body cover 2. In this example, the temperature sensor 6 is installed near the control device 5 and on the partition plate 2c. The temperature sensor 6 is electrically connected to the controller 100.

In addition, in the configuration of FIG. 17, near the fan 3, an external speed setting device 11 is provided on the duct 4. The external speed setting device 11 is an operation device that can perform setting so as to adjust the rotation speed (the number of rotations corresponding to that) of the fan 3 by the manual operation by the user, and is a device having, for example, a dial, a button and the like, and a circuit substrate and the like. The external speed setting device 11 may be a device that is connected to the fan 3 so as to be able to directly set the state of the fan 3, or may be a device that is connected to the controller 100 so as to be able to set the state of the fan 3 via the controller 100.

The controller 100 by the control device 5 uses the temperature sensor 6 to monitor the temperature in the charged particle beam apparatus 1, specifically, the temperature in the body cover 2, in particular, the temperature near the control device 5. Then, the controller 100 uses the temperature detection value of the temperature sensor 6 to hold the temperature stabilization in the charged particle beam apparatus 1. The basic operation and function of the control of the number of rotations of the fan 3 for this are the same as the first embodiment. The controller 100 performs changing so as to increase or decrease the numbers of rotations of the plurality of fans 3, and thus secures the total air quantity of the fan 3 at the constant value or more, and performs adjustment so that the amplitude of the vibration information of the captured image is held to be the specification value or less.

Figure 18:
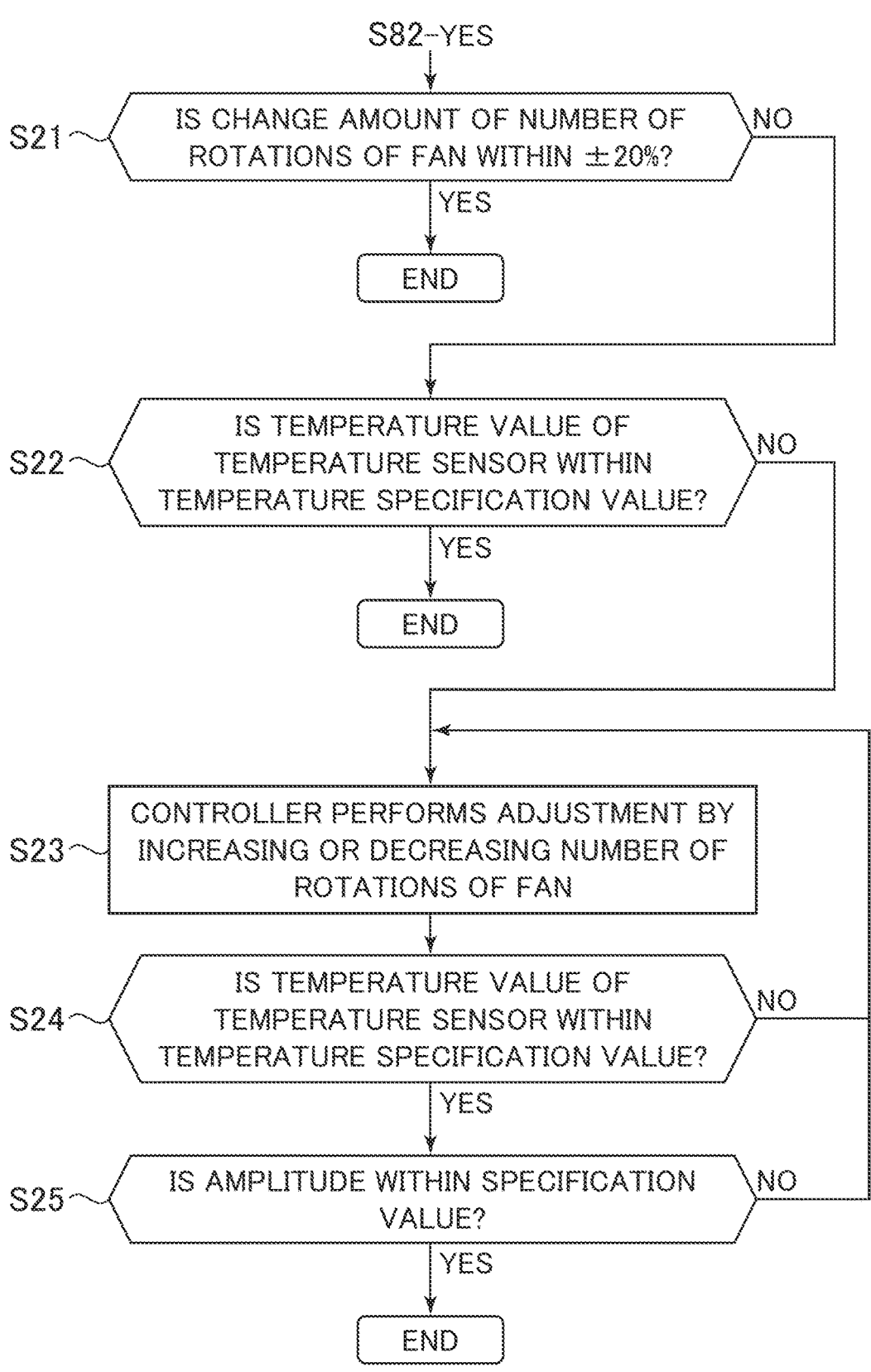
FIG. 18 is a flowchart of a process by a controller according to the second embodiment.

FIG. 18 illustrates the process flow of the fan control function 300 by the controller 100 of the second embodiment. The first half of the flow is omitted since it is the same as the flow of FIGS. 10 and 12. FIG. 18 illustrates the part after step S18. Whether after in step S82 of FIG. 12 described above, the amplitude is within the specification value is confirmed, and when the amplitude is within the specification value (YES), the control is not ended, and the controller 100 shifts to step S21 of FIG. 18.

In the second embodiment, the controller 100 confirms the temperature value of the temperature sensor 6 when the change amount of the number of rotations of the fan 3 exceeds ±20% in the fan's number-of-rotations control. Then, the controller 100 changes the number of rotations of the fan 3 such that the temperature is the specification value (in other words, a temperature threshold value) or less. The controller 100 confirms that the temperature is the specification value or less, and then, confirms the state of the vibration again, and when the amplitude is held to within specification value, the controller 100 ends the control operation.

In FIG. 18, in step S21, the controller 100 confirms whether the change amount of the number of rotations of the fan 3 in step S17 is within ±20%. When the change amount of the number of rotations of the fan 3 is within ±20% (YES), the control of this fan control function 300 is successful, and this flow is ended. When the change amount of the number of rotations of the fan 3 is not within ±20% (NO), the controller 100 goes to step S22.

In step S22, the controller 100 confirms whether the detection temperature value of the temperature sensor 6 is held to within the temperature specification value. When the detection temperature value of the temperature sensor 6 is held to within the temperature specification value (YES), this control is successful, and this flow is ended. When the detection temperature value of the temperature sensor 6 is not held to within the temperature specification value (NO), the controller 100 goes to step S23.

In step S23, the controller 100 performs adjustment by further increasing or decreasing the numbers of rotations of the plurality of fans 3. This adjustment method is not limited. The adjustment in this case is adjustment that has an aim in which the temperature value is within the temperature specification value.

After the adjustment in step S23, in step S24, the controller 100 confirms again whether the temperature value of the temperature sensor 6 is held to within the temperature specification value. When the temperature value of the temperature sensor 6 is not held to within the temperature specification value (NO), the controller 100 returns to step S23, and the controller 100 likewise attempts the control of the adjustment for satisfying the temperature specifications.

When in step S24, the temperature value of the temperature sensor 6 is held to within the temperature specification value (YES), in step S25, on the basis of the analysis of the vibration information from the captured image, the controller 100 confirms whether the amplitude is held to within the specification value. When the amplitude is held to within the specification value (YES), this control is successful, and this flow is ended. When the amplitude is not held to within the specification value (NO), the controller 100 returns to step S23, and the controller 100 likewise attempts the control of the adjustment.

It should be noted that when after the adjustment in steps S23 to S25 is attempted several times, but the specification value is not satisfied, the controller 100 may notify the current state to the user like step S20 and the like described above. That is, the controller 100 may notify that the specifications of the amplitude and the temperature are not satisfied and that the replacement of the fan 3 is recommended.

According to the second embodiment described above, in addition to the function of the first embodiment, while the number of rotations of the fan 3 is varied within the wider range exceeding ±20%, the temperature in the charged particle beam apparatus 1, specifically, the temperature in the body cover 2, can be stabilized.

Modification Example of Second Embodiment

In the second embodiment described above, the automatic control operation by the controller 100 is assumed, and the varying amount of the number of rotations is attempted by exceeding the limit of ±20%, thereby stabilizing the temperature in the apparatus by the total exhaust air quantity. However, when the unit amount in the increase/decrease change of the number of rotations of the fan 3, in other words, the stepwise width (the constant value in step S72 of FIG. 12), is the constant value, such as, for example, by 5%, the adjustment pattern for holding the state of the amplitude and temperature to within the specification value may be limited. Depending on the setting value of the unit amount, the control result may not satisfy the specification value.

Accordingly, as a modification example of the second embodiment, as an additional function, the adjustment of the number of rotations of each fan 3 by the manual operation of the user is enabled by using the external speed setting device 11 of FIG. 17. The user can set the number of rotations of each fan 3 to the desired value within the predetermined range of the number of rotations by operating the external speed setting device 11. This setting can be continuously changed by the amount finer than the unit amount (for example, 5%) in the increase/decrease change of the number of rotations of the fan 3 by the controller 100.

For example, when in step S20 of FIG. 12 described above, the amplitude does not satisfy the specification value after the number-of-rotations variable control, the controller 100 may perform the following in the case of notifying the state. The controller 100 notifies, to the user, the information including the causative fan (first fan) that is the fan 3 in which the number of rotations is adjusted and the number of rotations attempted at the time of the automatic adjustment of the fan 3, and notifies the recommendation of the manual adjustment of the number of rotations. On the basis of the information of the notification, the user manually operates the external speed setting device 11, and manually adjusts the number of rotations of the causative fan near the number of rotations at the time of the automatic adjustment. When this manual adjustment is performed, on the basis of the vibration information of the captured image, the controller 100 may confirm whether the amplitude satisfies the specification value, and notify the state of the fan 3. After this manual adjustment, the amplitude may be held to satisfy the specification value.

Likewise, when after in steps S23 to S25 of the fan's number-of-rotations increase/decrease adjustment of FIG. 18, the automatic adjustment by the controller 100 is attempted several times, the amplitude does not satisfy the specification value (for example, NO in S25), the controller 100 notifies, to the user, the causative fan, the information of the number of rotations, the recommendation of the manual adjustment of the number of rotations, and the like. The user receives the notification, manually operates the external speed setting value 11, and manually adjusts the number of rotations of the causative fan near the number of rotations at the time of the automatic adjustment. When this manual adjustment is performed, on the basis of the vibration information of the captured image, the controller 100 may confirm whether the amplitude satisfies the specification value, and notify the state of the fan 3. The user likewise repeats the adjustment according to the notification. After this manual adjustment, the amplitude may be held to satisfy the specification value.

In addition, in another modification example, the unit amount in the change of the increase or decrease of the number of rotations of the fan 3 by the controller 100 (for example, 5% in step S71) may be able to be variably set. For example, the user may be able to set the unit amount on the GUI screen 1050 (FIG. 16), or may be able to set the unit amount by operating the external speed setting device 11. According to this setting, the controller 100 performs the above automatic adjustment. After this automatic adjustment, the amplitude may be held to satisfy the specification value.

Third Embodiment

In the first and second embodiments described above, the frequency of the confirmation operation (the above diagnosis and check) related to the state of the fan 3 is assumed such that the confirmation operation is performed in, for example, the periodic diagnosis, such as once per day and at the time of the arbitrary maintenance operation. The specification value for the vibration described above (for example, the specification value x of the amplitude of FIG. 7) is set such that the case where the adverse influence appears in the length measurement value due to the occurrence of the shaking in the image is NG. Consequently, the longer operation time for suppressing the vibration to within the specification value is a concern. In the first embodiment and the like, even when the vibration to some degree is caused by the fan 3, the adjustment of the number of rotations is not performed in the period in which the amplitude is within the specification value, and only after the amplitude exceeds the specification value, the adjustment of the number of rotations is performed.

Accordingly, in a third embodiment, to prevent the longer operation time related to the fan's number-of-rotations control, in other words, also to achieve the control in a short period, a function is added. In this additional function, even with vibration to the extent that the vibration does not affect the length measurement value, the confirmation operation is performed under the following condition. In the third embodiment, the controller 100 sets, as a first threshold value for control, the value in which the rotation frequency F (the number of rotations R corresponding to that) is increased by the predetermined amount (defined as $\pm B$ % value) from the rotation frequency F (the number of rotations R corresponding to that) at the time of the previous confirmation. By setting the first threshold value for control, the confirmation and adjustment can be performed from at the time of the state where the increase of the amplitude due to the vibration caused by the fan 3 is relatively small. Thus, as a result, the possibility that the change amount of the number of rotations of the fan 3 is held to within $\pm 20$% becomes high, so that the operation time can be prevented from being longer.

Figure 19:
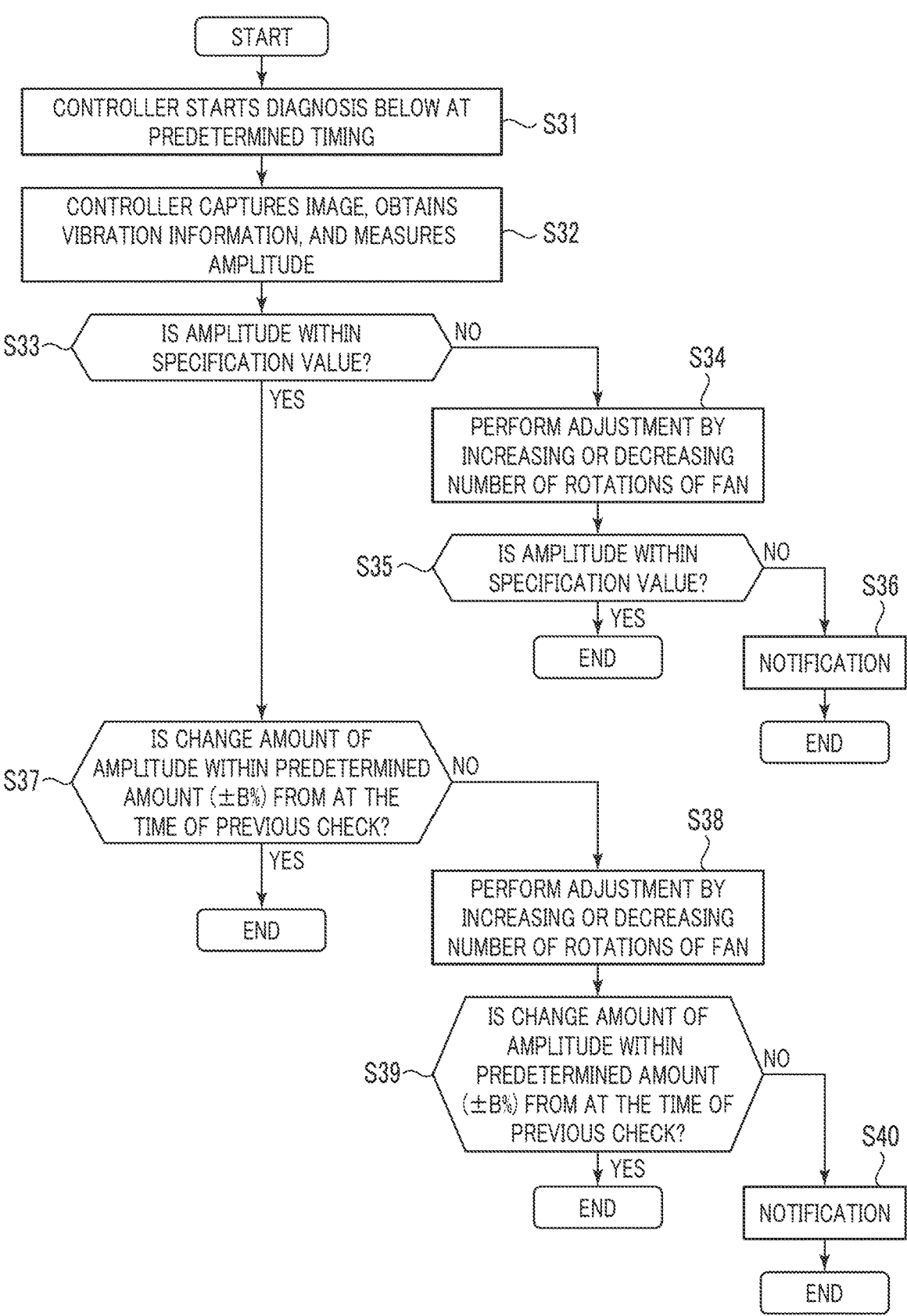
FIG. 19 is a flowchart of a process by a controller according to the third embodiment.

FIG. 19 illustrates the process flow of the fan control by the controller 100 of the third embodiment. This flow has steps S31 to S40. In step S31, the controller 100 starts diagnosis at a predetermined timing. In step S32, the controller 100 captures an image by the electron microscope 8, obtains vibration information from the captured image, and measures an amplitude. In step S33, the controller 100 confirms whether the above amplitude is within the specification value (for example, the $\alpha$ of FIG. 7). When the amplitude is within the specification value (YES), the controller 100 goes to step S37, and when the amplitude is not within the specification value (NO), the controller 100 goes to step S34.

In step S34, the controller 100 performs the adjustment of the increase or decrease of the number of rotations of the fan 3. For the adjustment of step S34, for example, the fan's number-of-rotations control in the first and second embodiments is likewise applicable. Thereafter, in step S35, on the basis of the vibration information, the controller 100 confirms whether the amplitude is held to within the specification value. When the amplitude is held to within the specification value (YES), this control is successful, and this flow is ended. When it is not held to within the specification value (NO), it goes to step S36. In step S36, the controller 100 notifies, to the user, the current state, and this flow is ended. The user receives the notification to confirm the state.

On the other hand, in step S37, the controller 100 confirms whether from at the time of the previous confirmation, the change amount of the amplitude of the vibration information is within the predetermined amount ($\pm B$ % value), that is, whether the change amount of the amplitude is within the first threshold value for control. When the change amount of the amplitude of the vibration information is within the predetermined value (YES), this flow is ended. When the change amount of the amplitude of the vibration information exceeds the predetermined value (NO), the controller 100 goes to step S38. The case where the controller 100 goes to step S38 is the case where the amplitude to some degree is caused by the fan 3, but the amplitude is within the specification value (OK), and the change amount of the amplitude from at the time of the previous confirmation exceeds the $\pm B$ % value.

In step S38, the controller 100 performs the adjustment of the increase or decrease of the number of rotations of the fan 3. For the adjustment of step S38, for example, the fan's number-of-rotations control in the first and second embodiments is likewise applicable. Thereafter, in step S39, the controller 100 confirms whether the change amount of the amplitude is within the predetermined amount ($\pm B$ % value) from at the time of the previous confirmation. When it is within the predetermined value (YES), this flow is ended. When it exceeds the predetermined value (NO), it goes to step S40. In step S40, the controller 100 notifies, to the user, the current state, and this flow is ended. The user receives the notification to confirm the state.

As described above, in the process flow of the third embodiment, even in the period in which the amplitude of the vibration information does not exceed the specification value, the confirmation and adjustment are performed under the condition in which the change amount of the amplitude exceeds the predetermined amount ($\pm B$ % value), and the control and adjustment of the fan 3 in a shorter period are enabled. It should be noted that the ±B % value (the first threshold value for control) is the setting value of this fan control function 300, and is, as an example, 30%.

Other Modification Example: On/Off Control of Fan

As another modification example, the following is also enabled. In the first embodiment and the like, the case where all of the plurality of fans 3 are basically brought into the on state (rotation operation state), and the numbers of rotations and air quantities of those fans 3 are variably controlled has been described. Without being limited to this, the fan's number-of-rotations control in the first embodiment and the like can also be added with the on/off control of each fan 3 of the plurality of fans 3. For example, on the basis of the analysis and judgement of the vibration information, some fans 3 are assumed to be identified as the fans 3 estimated to cause the vibration. In that case, the controller 100 may bring only some fans 3 (first fans) into the off state, bring the different fan 3 (second fan) into the on state, and perform adjustment such that the specification values are satisfied by varying the number of rotations and the air quantity of the different fan 3 (second fan).

Figure 20:
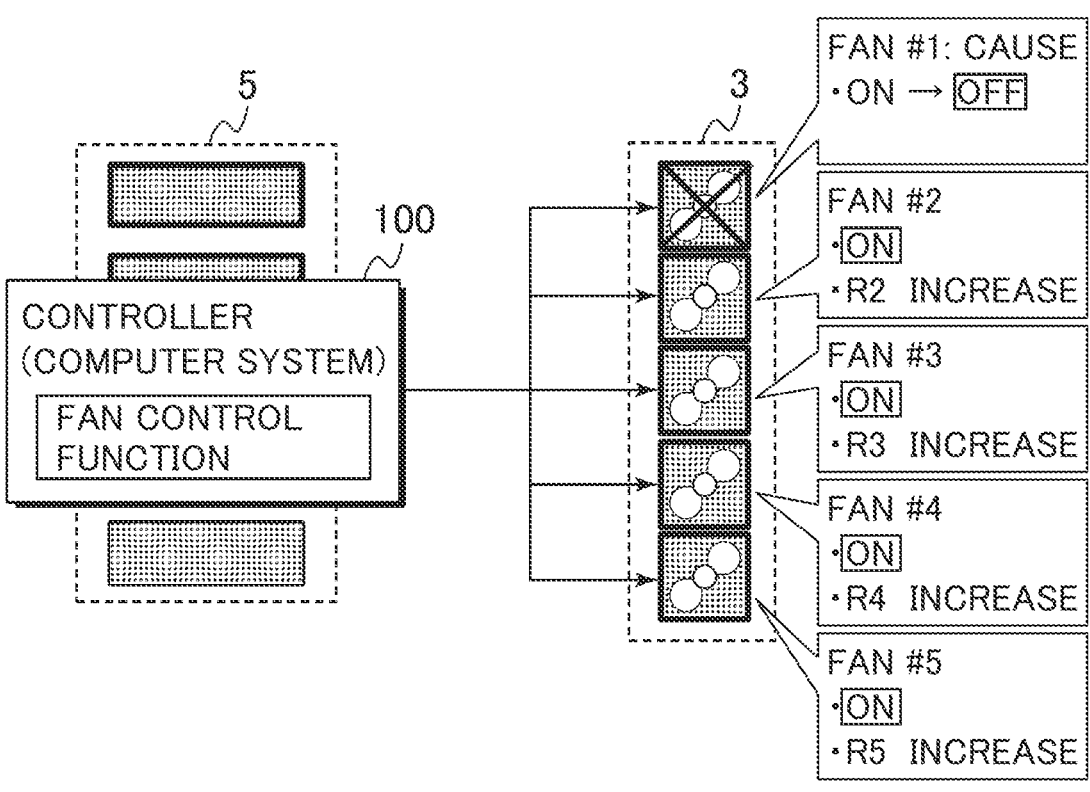

FIG. 20 illustrates the outline of the fan control of this modification example. On the basis of the judgement of the vibration information from the captured image, the controller 100 is assumed to identify, for example, the fan #1, as the fan 3 that causes resonance. The controller 100 switches only the fan #1 into the off state. In such a manner that the air quantity (Q1) by the decrease amount by the off of the fan #1 can be compensated for by using the fans #2 to #5 that are the different fans 3, the controller 100 increases the numbers of rotations of those fans #2 to #5 within the range, thereby securing the total air quantity at the constant value or more. For example, while the resonance frequency is avoided, the numbers of rotations R2 to R5 of the fans #2 to #5 may be separately increased respectively.

In addition, thereafter, the controller 100 may bring the fan #1 in the off state, into the on state once at the appropriate timing, thereby confirming the amplitude, and when the amplitude satisfies the specification value, the controller 100 may return the fan #1 from the off state to the on state.

Other Modification Example: External Computer System

In the first embodiment and the like, the case where the fan control function 300 (FIG. 3) is implemented on the controller 100 by one or more of the plurality of control devices 5 in the body cover 2 has been described, but the present invention is not limited to this. The fan control function 300 may be provided outside the body cover 2.

Figure 21:
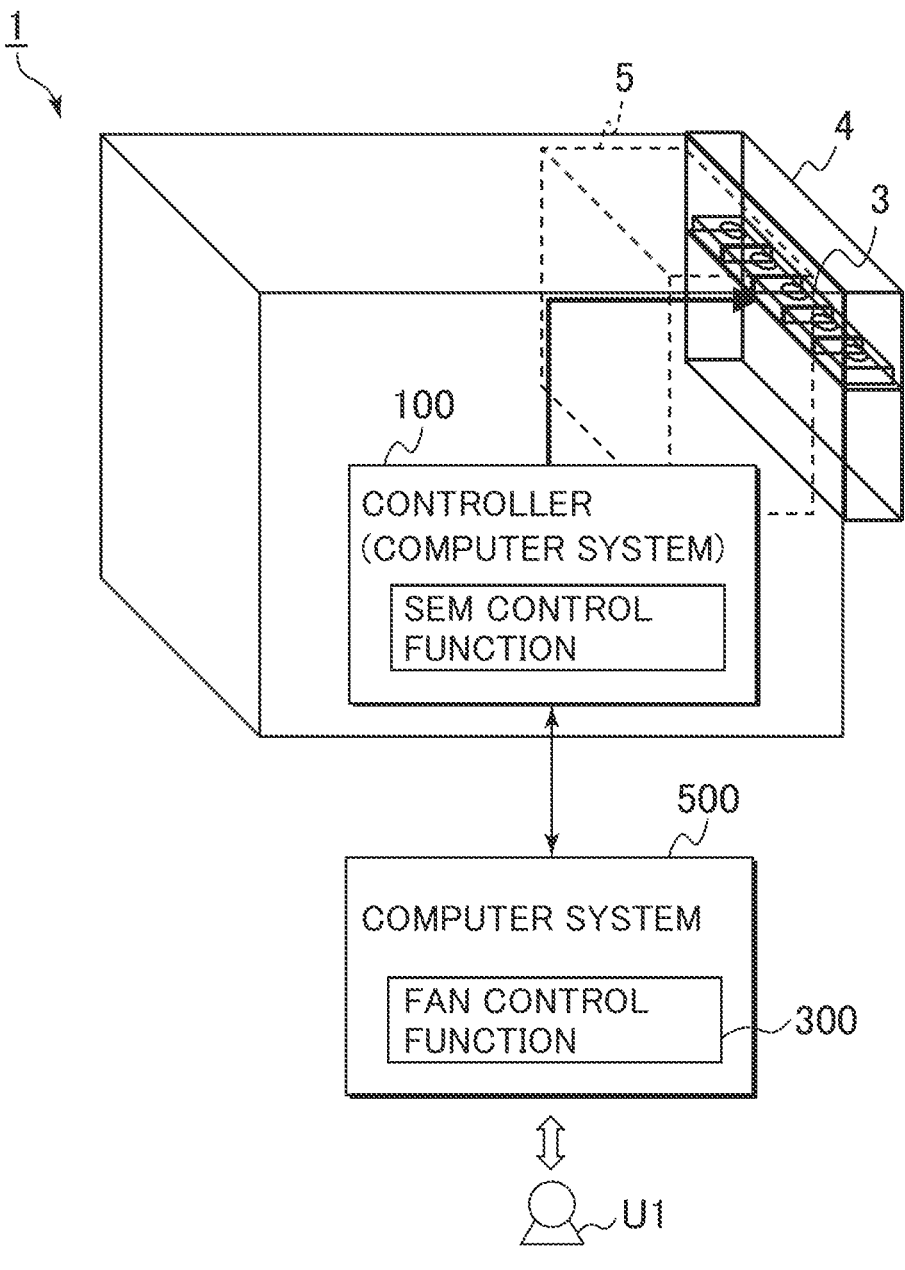

FIG. 21 illustrates the system configuration of this modification example. In the configuration of FIG. 21, the controller 100 is configured of the control device 5 in the body cover 2, and this controller 100 has the control function of the length measurement SEM. Then, aside from this controller 100, a computer system 500 on which the fan control function 300 is implemented is provided outside of the body cover 2. This computer system 500 is connected to the controller 100 by communication, or is directly connected to the plurality of fans 3. Then, the fan control function 300 of the computer system 500 performs the control of the numbers of rotations of the plurality of fans 3, like the first embodiment and the like. In addition, the computer system 500 functions as the user interface including the provision of the GUI screen 1050 described above (FIG. 16). Even in such the modification example, the same effect can be achieved.

Other Modification Example: Vibration Sensor

The first embodiment and the like have one feature in which as input information used as the source for the control of the fan 3, a captured image (SEM image) by the electron microscope 8 is used, and vibration information from the captured image is obtained. Without being limited to this, as the input information for obtaining the vibration information, information related to other than the captured image may be used. For example, the controller 100 may use imaging information at the time of imaging, the sample information of the wafer 15, and the like. The imaging information is information, such as information representing how the device of the constituent element of the body device (the electron microscope 8 and the like) is driving controlled from the controller 100 and the optical imaging condition.

In addition, the controller 100 may use the detection information of a sensor device of other type installed in the charged particle beam apparatus 1. For example, when a vibration sensor is installed in the sample chamber 9 or on the stage 14, the detection information of the vibration sensor may be used.

Figure 22:
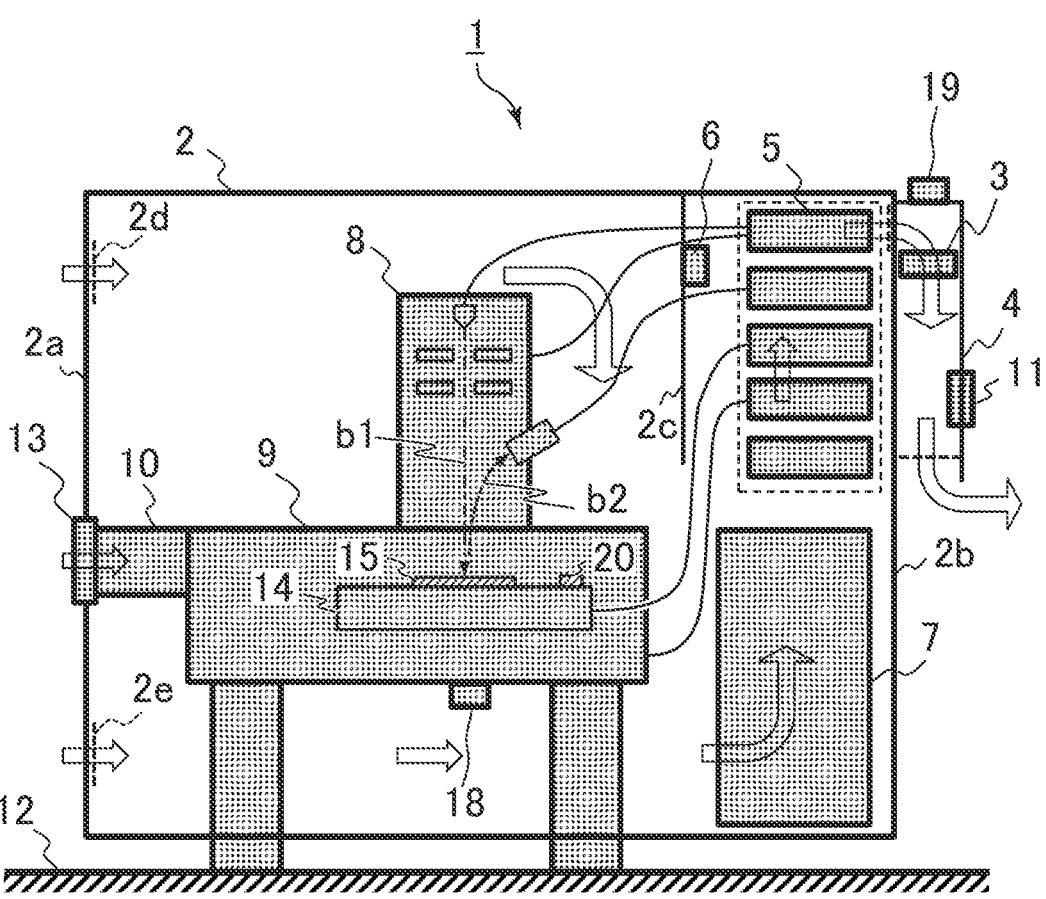

FIG. 22 illustrates the configuration of this modification example. In this configuration, a vibration sensor 18 is installed with respect to, for example, the bottom surface of the sample chamber 9, and in addition, a vibration sensor 19 is also installed with respect to the duct 4 in which the fan 3 is mounted. The vibration sensors 18, 19 are electrically connected to the controller 100. The controller 100 monitors, in time series, the state of vibration by inputting the detection information of the vibration sensor 18 and the detection information of the vibration sensor 19. At the time of the above diagnosis, the controller 100 obtains vibration information from a captured image by the electron microscope 8, and obtains the vibration information of the vibration sensor 18 and the vibration sensor 19. The controller 100 analyzes and judges those vibration information, and identifies the device portion that causes the vibration. For example, the controller 100 performs classification whether the device portion that causes image shaking is the fan 3 or the constituent element, such as the sample chamber 9 and the stage 14, other than the fan 3. When the fan 3 causes the vibration, the controller 100 likewise performs the fan's number-of-rotations control described above. Even in such the modification example, the same effect can be achieved.

Other Modification Example: Wafer and Pattern for Diagnosis

As other modification example, a predetermined sample and a predetermined pattern for diagnosis are previously prepared, and at the time of diagnosis, likewise, the predetermined sample and the predetermined pattern for diagnosis may be used every time. FIG. 22 illustrates the charged particle beam apparatus 1 together with the constituent elements related to this modification example. On the stage 14, a predetermined sample 20 for diagnosis (in other words, a sample wafer) is previously installed. The sample 20 may be a portion that configures the stage 14. At the time of diagnosis, the controller 100 movement controls the stage 14, and positions the predetermined pattern (for example, the above hole pattern) of the predetermined sample 20 to within the field of view of the electron microscope 8. Then, the controller 100 obtains an image obtained by imaging the predetermined pattern, and obtains the above vibration information.

In this modification example, the controller 100 captures the image of the same pattern under the same imaging condition every time at the time of diagnosis, and judges the state of the amplitude from the vibration information based on the captured image. Thus, the change in the state of the vibration of the charged particle beam apparatus 1 is easily grasped.

In addition, the controller 100 may hold, as history information, each data and information processed every time at the time of diagnosis, into the memory resources. In that case, the controller 100 can grasp the change on the time axis of the state of the vibration of the charged particle beam apparatus 1, which can be effectively used for the control and replacement operation of the fan 3.

The embodiments of this disclosure have been specifically described, but the present invention is not limited to the above embodiments, and various modifications can be made within the scope not departing from its purport. Except for the necessary constituent elements, the respective embodiments can be subjected to the addition, deletion, replacement, and the like of the constituent elements. Unless otherwise limited, each constituent element may include a single constituent element or a plurality of constituent elements. Forms in which the respective embodiments and modification examples are combined are also enabled.

LIST OF REFERENCE SIGNS

1: charged particle beam apparatus, 2: body cover, 3: air blower (fan), 4: duct, 5: control device, 8: electron microscope, 9: sample chamber, 14: stage, 100: controller

The invention claimed is:

1. A charged particle beam apparatus comprising:
a body device that is provided in a body cover;
a plurality of air blowers that are provided on the body cover; and a controller that controls the plurality of air blowers,
wherein the body device has a stage on which a sample is placed; and a microscope that images the sample, and wherein the controller obtains an image obtained by imaging the sample by the microscope, obtains vibration information from the image, compares the vibration information and a specification value, and on the basis of the result of the comparison, controls the numbers of rotations of the plurality of air blowers.

2. The charged particle beam apparatus according to claim 1, wherein in the number-of-rotations control, the controller decreases the number of rotations of at least one first air blower among the plurality of air blowers, and increases the number of rotations of at least one different second air blower among the plurality of air blowers.

3. The charged particle beam apparatus according to claim 2, wherein in the number-of-rotations control, the controller performs the number-of-rotations control so as to secure the total air quantity of the plurality of air blowers at a constant value or more.

4. The charged particle beam apparatus according to claim 1, wherein the controller confirms whether the amplitude of a frequency analysis result or a time waveform as the vibration information exceeds the specification value, and when the amplitude exceeds the specification value, the controller performs the number-of-rotations control.

5. The charged particle beam apparatus according to claim 1, wherein the vibration information is information that is obtained on the basis of the time displacement or spatial displacement of the position of the edge of a pattern that is formed on the sample.

6. The charged particle beam apparatus according to claim 1, wherein the controller estimates, on the basis of the comparison, whether vibration that affects the shaking of the image is caused by the plurality of air blowers, and when the vibration is estimated to be caused by the plurality of air blowers, the controller controls the numbers of rotations of the plurality of air blowers.

7. The charged particle beam apparatus according to claim 2, wherein the controller estimates, on the basis of the comparison, that the vibration that affects the shaking of the image is caused by at least one first air blower among the plurality of air blowers, and in the number-of-rotations control, the controller decreases the number of rotations of the first air blower, and increases the number of rotations of the second air blower.

8. The charged particle beam apparatus according to claim 6, wherein the controller performs control so as to switch the on state and the off state of the rotation operation of each air blower of the plurality of air blowers,
wherein the controller obtains, as the vibration information, first vibration information by capturing, as the image,
a first image when all of the plurality of air blowers are in the on state, wherein the controller obtains, as the vibration information, second vibration information by capturing, as the image,
a second image when all of the plurality of air blowers are in the off state, and wherein the controller uses the first vibration information and the second vibration information to estimate, on the basis of the comparison, whether the vibration is caused by the plurality of air blowers.

9. The charged particle beam apparatus according to claim 7, wherein the controller performs control so as to switch the on state and the off state of the rotation operation of each air blower of the plurality of air blowers,
wherein when only one air blower as the each air blower among the plurality of air blowers is brought into the on state or the off state, the controller captures, as the image, each image to obtain, as the vibration information, each vibration information, and wherein the controller uses the each vibration information to estimate, on the basis of the comparison, that the vibration is caused by the first air blower.

10. The charged particle beam apparatus according to claim 1, wherein the controller performs output that notifies, to a user, the states of the plurality of air blowers.

11. The charged particle beam apparatus according to claim 1, wherein in the body cover, a control device is provided, and wherein the controller is configured of the control device.

12. The charged particle beam apparatus according to claim 1, wherein in the body cover, a temperature sensor is provided, and wherein the controller confirms whether the temperature value of the temperature sensor is within a temperature specification value, and when the temperature value of the temperature sensor is not within the temperature specification value,
the controller performs the number-of-rotations control.

13. The charged particle beam apparatus according to claim 12, wherein when after the number-of-rotations control, the change amount of the number of rotations exceeds ±20%, the controller confirms whether the temperature value of the temperature sensor is within the temperature specification value, and when the temperature value of the temperature sensor is not within the temperature specification value, the controller performs the number-of-rotations control again.

14. The charged particle beam apparatus according to claim 12, wherein outside the body cover, an external speed setting device is provided, the external speed setting device capable of performing the adjustment of the number of rotations of the air blower by the manual operation of the user, and wherein when after the number-of-rotations control, the temperature value of the temperature sensor is not within the temperature specification value or when the vibration information does not satisfy the specification value, the controller performs output that notifies, to the user, the adjustment using the external speed setting device.

15. The charged particle beam apparatus according to claim 1, wherein even when from the result of the comparison, the vibration information satisfies the specification value, the controller confirms whether the change amount of the vibration information is within a first threshold value for control from at the time of the previous confirmation of the vibration information and the specification value, and when the change amount of the vibration information is not within the first threshold value for control, the controller controls the numbers of rotations of the plurality of air blowers.

16. The charged particle beam apparatus according to claim 10, wherein when after the control of the numbers of rotations of the plurality of air blowers, the vibration information does not satisfy the specification value, the controller performs the output that perform notification so as to recommend the maintenance or replacement of the plurality of air blowers.

\* \* \* \* \*